United States Patent
Nannapaneni et al.

(10) Patent No.: US 12,077,858 B2
(45) Date of Patent: Sep. 3, 2024

(54) TUNGSTEN DEPOSITION

(71) Applicant: Lam Research Corporation, Fremont, CA (US)

(72) Inventors: Pragna Nannapaneni, San Jose, CA (US); Novy Tjokro, Union City, CA (US); Sema Ermez, Santa Clara, CA (US); Ruopeng Deng, San Jose, CA (US); Tianhua Yu, Tracy, CA (US); Xiaolan Ba, Fremont, CA (US); Sanjay Gopinath, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/633,562

(22) PCT Filed: Aug. 10, 2020

(86) PCT No.: PCT/US2020/070394
§ 371 (c)(1),
(2) Date: Feb. 7, 2022

(87) PCT Pub. No.: WO2021/030836
PCT Pub. Date: Feb. 18, 2021

(65) Prior Publication Data
US 2022/0364232 A1    Nov. 17, 2022

(51) Int. Cl.
*C23C 16/455* (2006.01)
*C23C 16/44* (2006.01)
*C23C 16/52* (2006.01)

(52) U.S. Cl.
CPC .... *C23C 16/45527* (2013.01); *C23C 16/4402* (2013.01); *C23C 16/52* (2013.01)

(58) Field of Classification Search
CPC .......... C23C 16/45527; C23C 16/4402; C23C 16/52; C23C 16/0281; C23C 16/045;
(Continued)

(56) References Cited

U.S. PATENT DOCUMENTS

| 4,746,375 A | 5/1988 | Iacovangelo |
| 4,804,560 A | 2/1989 | Shioya et al. |

(Continued)

FOREIGN PATENT DOCUMENTS

| CN | 1455447 A | 11/2003 |
| CN | 101154576 A | 4/2008 |

(Continued)

OTHER PUBLICATIONS

Aldjapan.com "Principle-ALD Japan, Inc." [webpage] pp. 1-10. [retrieved from URL: https://aldjapan.com/%E5%8E%9F%E7%90%86/].

(Continued)

*Primary Examiner* — Michael G Miller
(74) *Attorney, Agent, or Firm* — Weaver Austin Villeneuve & Sampson LLP

(57) ABSTRACT

Described herein are methods of filling features with tungsten and related apparatus. The methods described herein involve deposition of a tungsten nucleation layer prior to deposition of a bulk layer. The methods involve multiple atomic layer deposition (ALD) cycles. According to various embodiments, both a boron-containing reducing agent and silicon-reducing agent may be pulses during a single cycle to react with a tungsten-containing precursor and form a tungsten film.

21 Claims, 9 Drawing Sheets

(58) Field of Classification Search
CPC ......... C23C 16/08; C23C 16/02; C23C 16/14; C23C 16/455345; H10B 41/27; H10B 43/27; H10B 41/50; H10B 43/50; H01L 21/28562; H01L 21/76876; H01L 21/76877

See application file for complete search history.

(56) References Cited

U.S. PATENT DOCUMENTS

| | | | |
|---|---|---|---|
| 4,874,719 A | 10/1989 | Kurosawa | |
| 4,962,063 A | 10/1990 | Maydan et al. | |
| 5,028,565 A | 7/1991 | Chang et al. | |
| 5,227,329 A | 7/1993 | Kobayashi et al. | |
| 5,250,329 A | 10/1993 | Miracky et al. | |
| 5,250,467 A | 10/1993 | Somekh et al. | |
| 5,308,655 A | 5/1994 | Eichman et al. | |
| 5,326,723 A | 7/1994 | Petro et al. | |
| 5,370,739 A | 12/1994 | Foster et al. | |
| 5,391,394 A | 2/1995 | Hansen | |
| 5,567,583 A | 10/1996 | Wang et al. | |
| 5,633,200 A | 5/1997 | Hu | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,833,817 A | 11/1998 | Tsai et al. | |
| 5,913,145 A | 6/1999 | Lu et al. | |
| 5,916,634 A | 6/1999 | Fleming et al. | |
| 5,926,720 A | 7/1999 | Zhao et al. | |
| 5,956,609 A | 9/1999 | Lee et al. | |
| 5,963,833 A | 10/1999 | Thakur | |
| 5,994,749 A | 11/1999 | Oda | |
| 6,001,729 A | 12/1999 | Shinriki et al. | |
| 6,017,818 A | 1/2000 | Lu | |
| 6,034,419 A | 3/2000 | Nicholls et al. | |
| 6,037,263 A | 3/2000 | Chang | |
| 6,066,366 A | 5/2000 | Berenbaum et al. | |
| 6,099,904 A | 8/2000 | Mak et al. | |
| 6,107,200 A | 8/2000 | Takagi et al. | |
| 6,143,082 A | 11/2000 | McInerney et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,260,266 B1 | 7/2001 | Tamaki | |
| 6,265,312 B1 | 7/2001 | Sidhwa et al. | |
| 6,277,744 B1 | 8/2001 | Yuan et al. | |
| 6,284,316 B1 | 9/2001 | Sandhu et al. | |
| 6,287,965 B1 | 9/2001 | Kang et al. | |
| 6,294,468 B1 | 9/2001 | Gould-Choquette et al. | |
| 6,297,152 B1 | 10/2001 | Itoh et al. | |
| 6,306,211 B1 | 10/2001 | Takahashi et al. | |
| 6,309,964 B1 | 10/2001 | Tsai et al. | |
| 6,309,966 B1 | 10/2001 | Govindarajan et al. | |
| 6,310,300 B1 | 10/2001 | Cooney, III et al. | |
| 6,340,629 B1 | 1/2002 | Yeo et al. | |
| 6,355,558 B1 | 3/2002 | Dixit et al. | |
| 6,404,054 B1 | 6/2002 | Oh et al. | |
| 6,429,126 B1 | 8/2002 | Herner et al. | |
| 6,465,347 B2 | 10/2002 | Ishizuka et al. | |
| 6,491,978 B1 | 12/2002 | Kalyanam | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,581,258 B2 | 6/2003 | Yoneda et al. | |
| 6,593,233 B1 | 7/2003 | Miyazaki et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,777,331 B2 | 8/2004 | Nguyen | |
| 6,790,773 B1 | 9/2004 | Drewery et al. | |
| 6,794,287 B2 | 9/2004 | Saanila et al. | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,903,016 B2 | 6/2005 | Cohen | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,235,486 B2 | 6/2007 | Kori et al. | |
| 7,262,125 B2 | 8/2007 | Wongsenakhum et al. | |
| 7,338,900 B2 | 3/2008 | Mizuno et al. | |
| 7,355,254 B2 | 4/2008 | Datta et al. | |
| 7,405,158 B2 | 7/2008 | Lai et al. | |
| 7,416,979 B2 | 8/2008 | Yoon et al. | |
| 7,419,904 B2 | 9/2008 | Kato | |
| 7,429,402 B2 | 9/2008 | Gandikota et al. | |
| 7,465,665 B2 | 12/2008 | Xi et al. | |
| 7,465,666 B2 | 12/2008 | Kori et al. | |
| 7,485,340 B2 | 2/2009 | Elers et al. | |
| 7,501,343 B2 | 3/2009 | Byun et al. | |
| 7,501,344 B2 | 3/2009 | Byun et al. | |
| 7,563,718 B2 | 7/2009 | Kim | |
| 7,589,017 B2 | 9/2009 | Chan et al. | |
| 7,595,263 B2 | 9/2009 | Chung et al. | |
| 7,605,083 B2 | 10/2009 | Lai et al. | |
| 7,611,990 B2 | 11/2009 | Yoon et al. | |
| 7,655,567 B1 | 2/2010 | Gao et al. | |
| 7,674,715 B2 | 3/2010 | Kori et al. | |
| 7,675,119 B2 | 3/2010 | Taguwa | |
| 7,691,749 B2 | 4/2010 | Levy et al. | |
| 7,695,563 B2 | 4/2010 | Lu et al. | |
| 7,709,385 B2 | 5/2010 | Xi et al. | |
| 7,732,327 B2 | 6/2010 | Lee et al. | |
| 7,745,329 B2 | 6/2010 | Wang et al. | |
| 7,745,333 B2 | 6/2010 | Lai et al. | |
| 7,749,815 B2 | 7/2010 | Byun | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 7,964,505 B2 | 6/2011 | Khandelwal et al. | |
| 7,977,243 B2 | 7/2011 | Sakamoto et al. | |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,071,478 B2 | 12/2011 | Wu et al. | |
| 8,087,966 B2 | 1/2012 | Hebbinghaus et al. | |
| 8,101,521 B1 | 1/2012 | Gao et al. | |
| 8,110,877 B2 | 2/2012 | Mukherjee et al. | |
| 8,119,527 B1 | 2/2012 | Chadrashekar et al. | |
| 8,129,270 B2 | 3/2012 | Chandrashekar et al. | |
| 8,207,062 B2 | 6/2012 | Gao et al. | |
| 8,258,057 B2 | 9/2012 | Kuhn et al. | |
| 8,329,576 B2 | 12/2012 | Chan et al. | |
| 8,367,546 B2 | 2/2013 | Humayun et al. | |
| 8,409,985 B2 | 4/2013 | Chan et al. | |
| 8,409,987 B2 | 4/2013 | Chandrashekar et al. | |
| 8,551,885 B2 | 10/2013 | Chen et al. | |
| 8,623,733 B2 | 1/2014 | Chen et al. | |
| 8,709,948 B2 | 4/2014 | Danek et al. | |
| 8,853,080 B2 | 10/2014 | Guan et al. | |
| 8,975,184 B2 | 3/2015 | Chen et al. | |
| 8,993,055 B2 | 3/2015 | Rahtu et al. | |
| 9,034,760 B2 | 5/2015 | Chen et al. | |
| 9,064,684 B1 | 6/2015 | Mui et al. | |
| 9,076,843 B2 | 7/2015 | Lee et al. | |
| 9,153,486 B2 | 10/2015 | Arghavani et al. | |
| 9,159,571 B2 | 10/2015 | Humayun et al. | |
| 9,236,297 B2 | 1/2016 | Chen et al. | |
| 9,240,347 B2 | 1/2016 | Chandrashekar et al. | |
| 9,583,385 B2 | 2/2017 | Lee et al. | |
| 9,589,808 B2 | 3/2017 | Bamnolker et al. | |
| 9,613,818 B2 | 4/2017 | Ba et al. | |

(56) References Cited

U.S. PATENT DOCUMENTS

| | | |
|---|---|---|
| 9,653,353 B2 | 5/2017 | Chandrashekar et al. |
| 9,673,146 B2 | 6/2017 | Chen et al. |
| 9,754,824 B2 | 9/2017 | Schloss et al. |
| 9,969,622 B2 | 5/2018 | Lei et al. |
| 9,978,605 B2 | 5/2018 | Bamnolker et al. |
| 10,103,058 B2 | 10/2018 | Chandrashekar et al. |
| 10,546,751 B2 | 1/2020 | Bamnolker et al. |
| 11,348,795 B2 | 5/2022 | Schloss et al. |
| 11,549,175 B2 | 1/2023 | Butail et al. |
| 2001/0007797 A1 | 7/2001 | Jang et al. |
| 2001/0008808 A1 | 7/2001 | Gonzalez |
| 2001/0014533 A1 | 8/2001 | Sun |
| 2001/0015494 A1 | 8/2001 | Ahn |
| 2001/0044041 A1 | 11/2001 | Badding et al. |
| 2002/0037630 A1 | 3/2002 | Agarwal et al. |
| 2002/0048938 A1 | 4/2002 | Ishizuka et al. |
| 2002/0090796 A1 | 7/2002 | Desai et al. |
| 2002/0117399 A1 | 8/2002 | Chen et al. |
| 2002/0155722 A1 | 10/2002 | Satta et al. |
| 2002/0168840 A1 | 11/2002 | Hong et al. |
| 2002/0177316 A1 | 11/2002 | Miller et al. |
| 2002/0190379 A1 | 12/2002 | Jian et al. |
| 2002/0192953 A1 | 12/2002 | Wang et al. |
| 2003/0013300 A1 | 1/2003 | Byun |
| 2003/0059980 A1 | 3/2003 | Chen et al. |
| 2003/0082296 A1 | 5/2003 | Elers et al. |
| 2003/0082902 A1 | 5/2003 | Fukui et al. |
| 2003/0091870 A1 | 5/2003 | Bhowmik et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0129828 A1 | 7/2003 | Cohen |
| 2003/0190802 A1 | 10/2003 | Wang et al. |
| 2003/0209193 A1 | 11/2003 | Van Wijck |
| 2003/0224217 A1 | 12/2003 | Byun et al. |
| 2004/0014315 A1 | 1/2004 | Lai et al. |
| 2004/0044127 A1 | 3/2004 | Okubo et al. |
| 2004/0142557 A1 | 7/2004 | Levy et al. |
| 2004/0151845 A1 | 8/2004 | Nguyen et al. |
| 2004/0202786 A1 | 10/2004 | Wongsenakhum et al. |
| 2004/0206267 A1 | 10/2004 | Sambasivan et al. |
| 2004/0247788 A1 | 12/2004 | Fang et al. |
| 2005/0009325 A1 | 1/2005 | Chung et al. |
| 2005/0031786 A1 | 2/2005 | Lee et al. |
| 2005/0059236 A1 | 3/2005 | Nishida et al. |
| 2005/0059241 A1 | 3/2005 | Kori et al. |
| 2005/0136594 A1 | 6/2005 | Kim |
| 2005/0191803 A1 | 9/2005 | Matsuse et al. |
| 2006/0003581 A1 | 1/2006 | Johnston et al. |
| 2006/0009034 A1 | 1/2006 | Lai et al. |
| 2006/0040052 A1 | 2/2006 | Fang et al. |
| 2006/0094238 A1 | 5/2006 | Levy et al. |
| 2006/0145190 A1 | 7/2006 | Salzman et al. |
| 2006/0211244 A1 | 9/2006 | Deshpande et al. |
| 2006/0265100 A1 | 11/2006 | Li |
| 2006/0284317 A1 | 12/2006 | Ito et al. |
| 2007/0009658 A1 | 1/2007 | Yoo et al. |
| 2007/0087560 A1 | 4/2007 | Kwak et al. |
| 2007/0099420 A1 | 5/2007 | Dominguez et al. |
| 2007/0190780 A1 | 8/2007 | Chung et al. |
| 2007/0199922 A1 | 8/2007 | Shen et al. |
| 2007/0264105 A1 | 11/2007 | Pharand et al. |
| 2008/0017891 A1 | 1/2008 | Datta et al. |
| 2008/0045010 A1 | 2/2008 | Wongsenakhum et al. |
| 2008/0081127 A1 | 4/2008 | Thompson et al. |
| 2008/0081452 A1 | 4/2008 | Kim et al. |
| 2008/0081453 A1 | 4/2008 | Kim et al. |
| 2008/0081470 A1 | 4/2008 | Clark |
| 2008/0124926 A1 | 5/2008 | Chan et al. |
| 2008/0248649 A1 | 10/2008 | Adetutu et al. |
| 2008/0254619 A1 | 10/2008 | Lin et al. |
| 2008/0254623 A1 | 10/2008 | Chan et al. |
| 2008/0268642 A1 | 10/2008 | Yanagita et al. |
| 2008/0280438 A1 | 11/2008 | Lai et al. |
| 2008/0283844 A1 | 11/2008 | Hoshi et al. |
| 2008/0317954 A1 | 12/2008 | Lu et al. |
| 2008/0317972 A1 | 12/2008 | Hendriks et al. |
| 2009/0045517 A1 | 2/2009 | Sugiura et al. |
| 2009/0050937 A1 | 2/2009 | Murata et al. |
| 2009/0053893 A1 | 2/2009 | Khandelwal et al. |
| 2009/0137117 A1 | 5/2009 | Park et al. |
| 2009/0142509 A1 | 6/2009 | Yamamoto |
| 2009/0149022 A1 | 6/2009 | Chan et al. |
| 2009/0156004 A1 | 6/2009 | Kori et al. |
| 2009/0160030 A1 | 6/2009 | Tuttle |
| 2009/0163025 A1 | 6/2009 | Humayun et al. |
| 2009/0315154 A1 | 12/2009 | Kirby et al. |
| 2009/0321943 A1 | 12/2009 | Meldrim et al. |
| 2010/0007797 A1 | 1/2010 | Stojancic |
| 2010/0035427 A1 | 2/2010 | Chan et al. |
| 2010/0055904 A1 | 3/2010 | Chen et al. |
| 2010/0062149 A1 | 3/2010 | Ma et al. |
| 2010/0072623 A1 | 3/2010 | Prindle et al. |
| 2010/0120245 A1 | 5/2010 | Tjandra et al. |
| 2010/0130002 A1 | 5/2010 | Dao et al. |
| 2010/0130003 A1 | 5/2010 | Lin et al. |
| 2010/0144140 A1 | 6/2010 | Chandrashekar et al. |
| 2010/0155846 A1 | 6/2010 | Mukherjee et al. |
| 2010/0159694 A1 | 6/2010 | Chandrashekar et al. |
| 2010/0167527 A1 | 7/2010 | Wu et al. |
| 2010/0171220 A1 | 7/2010 | Huang |
| 2010/0244141 A1 | 9/2010 | Beyer et al. |
| 2010/0244260 A1 | 9/2010 | Hinomura |
| 2010/0267230 A1 | 10/2010 | Chandrashekar et al. |
| 2010/0267235 A1 | 10/2010 | Chen et al. |
| 2010/0273327 A1 | 10/2010 | Chan et al. |
| 2010/0330800 A1 | 12/2010 | Ivanov et al. |
| 2011/0020546 A1 | 1/2011 | Hamalainen et al. |
| 2011/0059608 A1 | 3/2011 | Gao et al. |
| 2011/0156154 A1 | 6/2011 | Hoentschel et al. |
| 2011/0221044 A1 | 9/2011 | Danek et al. |
| 2011/0223763 A1 | 9/2011 | Chan et al. |
| 2011/0233778 A1 | 9/2011 | Lee et al. |
| 2011/0236594 A1 | 9/2011 | Haverkamp et al. |
| 2011/0281438 A1 | 11/2011 | Lee et al. |
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0077342 A1 | 3/2012 | Gao et al. |
| 2012/0164832 A1 | 6/2012 | Chandrashekar et al. |
| 2012/0199887 A1 | 8/2012 | Chan et al. |
| 2012/0225192 A1 | 9/2012 | Yudovsky et al. |
| 2012/0231626 A1 | 9/2012 | Lee et al. |
| 2012/0244699 A1 | 9/2012 | Khandelwal et al. |
| 2012/0294874 A1 | 11/2012 | Macary et al. |
| 2013/0043554 A1 | 2/2013 | Piper |
| 2013/0062677 A1 | 3/2013 | Li et al. |
| 2013/0109172 A1 | 5/2013 | Collins et al. |
| 2013/0168864 A1 | 7/2013 | Lee et al. |
| 2013/0285195 A1 | 10/2013 | Piper |
| 2013/0302980 A1 | 11/2013 | Chandrashekar et al. |
| 2014/0011358 A1 | 1/2014 | Chen et al. |
| 2014/0027664 A1 | 1/2014 | Lei et al. |
| 2014/0030889 A1 | 1/2014 | Chen et al. |
| 2014/0061784 A1 | 3/2014 | Kang |
| 2014/0061931 A1 | 3/2014 | Kang |
| 2014/0073135 A1 | 3/2014 | Guan et al. |
| 2014/0154883 A1 | 6/2014 | Humayun et al. |
| 2014/0162451 A1 | 6/2014 | Chen et al. |
| 2014/0209026 A1 | 7/2014 | LaVoie et al. |
| 2014/0308812 A1 | 10/2014 | Arghavani et al. |
| 2014/0319614 A1 | 10/2014 | Paul et al. |
| 2015/0037972 A1 | 2/2015 | Danek et al. |
| 2015/0056803 A1 | 2/2015 | Chandrashekar et al. |
| 2015/0179461 A1 | 6/2015 | Bamnolker et al. |
| 2015/0240359 A1 | 8/2015 | Jdira et al. |
| 2015/0279732 A1 | 10/2015 | Lee et al. |
| 2015/0325475 A1 | 11/2015 | Bamnolker et al. |
| 2016/0118345 A1 | 4/2016 | Chen et al. |
| 2016/0190008 A1 | 6/2016 | Chandrashekar et al. |
| 2016/0233220 A1* | 8/2016 | Danek .................. H10B 43/27 |
| 2016/0293467 A1 | 10/2016 | Caveney et al. |
| 2016/0336222 A1 | 11/2016 | Knapp et al. |
| 2016/0351401 A1 | 12/2016 | Ba et al. |

(56) References Cited

U.S. PATENT DOCUMENTS

| | | |
|---|---|---|
| 2016/0351402 A1 | 12/2016 | Suzuki et al. |
| 2016/0351444 A1 | 12/2016 | Schloss et al. |
| 2017/0040214 A1 | 2/2017 | Lai et al. |
| 2017/0069527 A1 | 3/2017 | Haukka et al. |
| 2017/0117155 A1 | 4/2017 | Bamnolker et al. |
| 2017/0133231 A1 | 5/2017 | Bamnolker et al. |
| 2017/0306479 A1 | 10/2017 | Raisanen et al. |
| 2017/0306490 A1 | 10/2017 | Chan et al. |
| 2017/0365513 A1 | 12/2017 | Yang et al. |
| 2018/0053660 A1 | 2/2018 | Jandl et al. |
| 2018/0076042 A1 | 3/2018 | Cheng et al. |
| 2018/0240675 A1 | 8/2018 | Bamnolker et al. |
| 2018/0247832 A1 | 8/2018 | Fischer et al. |
| 2019/0019725 A1 | 1/2019 | Chandrashekar et al. |
| 2021/0238736 A1 | 8/2021 | Butail et al. |
| 2021/0335617 A1 | 10/2021 | Deng et al. |
| 2021/0348271 A1 | 11/2021 | Mishra et al. |
| 2022/0037163 A1 | 2/2022 | Yang et al. |
| 2022/0181158 A1 | 6/2022 | Bowes et al. |
| 2022/0254685 A1 | 8/2022 | Ermez et al. |
| 2023/0130557 A1 | 4/2023 | Birru et al. |
| 2023/0290639 A1 | 9/2023 | Schloss et al. |

FOREIGN PATENT DOCUMENTS

| | | |
|---|---|---|
| CN | 101213320 A | 7/2008 |
| CN | 101308794 A | 11/2008 |
| CN | 101447427 A | 6/2009 |
| CN | 101540294 A | 9/2009 |
| CN | 101572291 A | 11/2009 |
| CN | 101770978 A | 7/2010 |
| CN | 101789369 A | 7/2010 |
| CN | 101952945 A | 1/2011 |
| CN | 101970352 A | 2/2011 |
| CN | 102084462 A | 6/2011 |
| CN | 102867953 A | 1/2013 |
| CN | 103125013 A | 5/2013 |
| CN | 103132046 A | 6/2013 |
| CN | 103579184 A | 2/2014 |
| CN | 105097446 A | 11/2015 |
| CN | 107768304 A | 3/2018 |
| CN | 104752339 B | 6/2019 |
| CN | 111357083 A | 6/2020 |
| CN | 110004429 B | 8/2021 |
| EP | 0437110 A2 | 7/1991 |
| EP | 1156132 A2 | 11/2001 |
| EP | 1179838 A2 | 2/2002 |
| JP | S5629648 A | 3/1981 |
| JP | S63274772 A | 11/1988 |
| JP | H0266399 A | 3/1990 |
| JP | H02187031 A | 7/1990 |
| JP | H04142061 A | 5/1992 |
| JP | H04216630 A | 8/1992 |
| JP | H05226280 A | 9/1993 |
| JP | H07147321 A | 6/1995 |
| JP | H07226393 A | 8/1995 |
| JP | H08115984 A | 5/1996 |
| JP | H08325735 A | 12/1996 |
| JP | H0922896 A | 1/1997 |
| JP | H0927596 A | 1/1997 |
| JP | H10144688 A | 5/1998 |
| JP | H10163132 A | 6/1998 |
| JP | 2966406 B2 | 10/1999 |
| JP | H11330006 A | 11/1999 |
| JP | 2000208516 A | 7/2000 |
| JP | 2000235962 A | 8/2000 |
| JP | 2001525889 A | 12/2001 |
| JP | 2002016066 A | 1/2002 |
| JP | 2002124488 A | 4/2002 |
| JP | 2003193233 A | 7/2003 |
| JP | 2004235456 A | 8/2004 |
| JP | 2004273764 A | 9/2004 |
| JP | 2004536960 A | 12/2004 |
| JP | 2005029821 A | 2/2005 |
| JP | 2005518088 A | 6/2005 |
| JP | 2007009298 A | 1/2007 |
| JP | 2007027627 A | 2/2007 |
| JP | 2007027680 A | 2/2007 |
| JP | 2007507892 A | 3/2007 |
| JP | 2007520052 A | 7/2007 |
| JP | 2007250907 A | 9/2007 |
| JP | 2007251164 A | 9/2007 |
| JP | 2008016803 A | 1/2008 |
| JP | 2008060603 A | 3/2008 |
| JP | 2008091844 A | 4/2008 |
| JP | 2008283220 A | 11/2008 |
| JP | 2008303466 A | 12/2008 |
| JP | 2009024252 A | 2/2009 |
| JP | 2009144242 A | 7/2009 |
| JP | 2009533877 A | 9/2009 |
| JP | 2009253008 A | 10/2009 |
| JP | 2009540123 A | 11/2009 |
| JP | 2010251760 A | 11/2010 |
| JP | 2011035366 A | 2/2011 |
| JP | 2011192680 A | 9/2011 |
| JP | 2013080891 A | 5/2013 |
| JP | 2014049747 A | 3/2014 |
| JP | 2015067869 A | 4/2015 |
| JP | 2015514160 A | 5/2015 |
| JP | 2015221940 A | 12/2015 |
| JP | 2017008412 A | 1/2017 |
| JP | 2017014615 A | 1/2017 |
| JP | 2017053024 A | 3/2017 |
| KR | 100196018 B1 | 6/1999 |
| KR | 100272523 B1 | 12/2000 |
| KR | 20010093766 A | 10/2001 |
| KR | 20020040877 A | 5/2002 |
| KR | 20020049730 A | 6/2002 |
| KR | 20030050652 A | 6/2003 |
| KR | 20040085153 A | 10/2004 |
| KR | 20050022261 A | 3/2005 |
| KR | 20050054122 A | 6/2005 |
| KR | 20050068555 A | 7/2005 |
| KR | 20050087428 A | 8/2005 |
| KR | 20060087844 A | 8/2006 |
| KR | 100705936 B1 | 4/2007 |
| KR | 20080001460 A | 1/2008 |
| KR | 20080015129 A | 2/2008 |
| KR | 20080036679 A | 4/2008 |
| KR | 20080060012 A | 7/2008 |
| KR | 20080061978 A | 7/2008 |
| KR | 20080101745 A | 11/2008 |
| KR | 20080110897 A | 12/2008 |
| KR | 20090068187 A | 6/2009 |
| KR | 20090074560 A | 7/2009 |
| KR | 20090095546 A | 9/2009 |
| KR | 20090103815 A | 10/2009 |
| KR | 20100014714 A | 2/2010 |
| KR | 20100029952 A | 3/2010 |
| KR | 20100114856 A | 10/2010 |
| KR | 20110027607 A | 3/2011 |
| KR | 20110056494 A | 5/2011 |
| KR | 20110084166 A | 7/2011 |
| KR | 20110105645 A | 9/2011 |
| KR | 20110108382 A | 10/2011 |
| KR | 20120005992 A | 1/2012 |
| KR | 20130119519 A | 10/2013 |
| KR | 20140028992 A | 3/2014 |
| KR | 101495372 B1 | 2/2015 |
| KR | 20150128615 A | 11/2015 |
| KR | 20160039139 A | 4/2016 |
| KR | 20160140458 A | 12/2016 |
| KR | 20180101745 A | 9/2018 |
| KR | 102255768 B1 | 5/2021 |
| TW | 310461 B | 7/1997 |
| TW | 434708 B | 5/2001 |
| TW | 452607 B | 9/2001 |
| TW | 567544 B | 12/2003 |
| TW | 589684 B | 6/2004 |
| TW | 200421465 A | 10/2004 |
| TW | 200626748 A | 8/2006 |
| TW | 200710968 A | 3/2007 |
| TW | 201405781 A | 2/2014 |
| TW | 201409697 A | 3/2014 |

(56) References Cited

FOREIGN PATENT DOCUMENTS

| TW | 201519317 A | 5/2015 |
|---|---|---|
| TW | 201715067 A | 5/2017 |
| WO | WO-9851838 A1 | 11/1998 |
| WO | WO-0127347 A1 | 4/2001 |
| WO | WO-0129893 A1 | 4/2001 |
| WO | WO-0241379 A1 | 5/2002 |
| WO | WO-02101114 A1 | 12/2002 |
| WO | WO-03029515 A2 | 4/2003 |
| WO | WO-2005027211 A1 | 3/2005 |
| WO | WO-2005034223 A1 | 4/2005 |
| WO | WO-2007121249 A2 | 10/2007 |
| WO | WO-2007146537 A2 | 12/2007 |
| WO | WO-2010025357 A2 | 3/2010 |
| WO | WO-2011119293 A2 | 9/2011 |
| WO | WO-2013148444 A1 | 10/2013 |
| WO | WO-2013148880 A1 | 10/2013 |
| WO | WO-2014058536 A1 | 4/2014 |
| WO | WO-2017123967 A1 | 7/2017 |
| WO | WO-2019036292 A1 | 2/2019 |
| WO | WO-2019055317 A1 | 3/2019 |
| WO | WO-2020185618 A1 | 9/2020 |
| WO | WO-2021178399 A1 | 9/2021 |

OTHER PUBLICATIONS

Becker, Jill (Apr. 7, 2003) "Diffusion barrier properties of tungsten nitride films grown by atomic layer deposition from bis(tert-butylimido)bis(dimethylamido)tungsten and ammonia," Applied Physics Letters, 82(14):2239-2241, [Retrieved online Dec. 13, 2013 at http://dx.doi.org/10.1063/1.1565699].
Bell et al. (Jan. 1996) "Batch Reactor Kinetic Studies of Tungsten LPCVD from Silane and Tungsten Hexafluoride", J. Electrochem. Soc., 143(1):296-302.
Chinese Fifth Office Action dated Aug. 24, 2018 issued in Application No. CN 201380022693.8.
Chinese Fifth Office Action dated May 5, 2015 issued in Application No. CN 200980133560.1.
Chinese First Office Action dated Jun. 2, 2017 issued in Application No. CN 201410856793.7.
Chinese First Office Action dated Mar. 18, 2016 issued in Application No. CN 201380022693.8.
Chinese First Office Action dated Oct. 27, 2020 issued in Application No. CN 201811491805.5.
Chinese First Office Action dated Sep. 18, 2012 issued in Application No. CN 200980133560.1.
Chinese First Office Action dated Sep. 6, 2015 issued in Application No. CN 201310320848.8.
Chinese Fourth Office Action dated Jan. 5, 2015 issued in Application No. CN 200980133560.1.
Chinese Fourth Office Action dated Mar. 15, 2018 issued in Application No. CN 201380022693.8.
Chinese Second Office Action dated Aug. 7, 2013 issued in Application No. CN 200980133560.1.
Chinese Second Office Action dated Feb. 5, 2018 issued in Application No. CN 201410856793.7.
Chinese Second Office Action dated Jan. 23, 2017 issued in Application No. CN 201380022693.8.
Chinese Second Office Action dated May 16, 2016 issued in Application No. CN 201310320848.8.
Chinese Third Office Action dated Apr. 22, 2014 issued in Application No. CN 200980133560.1.
Chinese Third Office Action dated Oct. 8, 2018 issued in Application No. CN 201410856793.7.
Chinese Third Office Action dated Sep. 25, 2017 issued in Application No. CN 201380022693.8.
Collins et al. (Jan. 21, 2003) "Pulsed Deposition of Ultra Thin Tungsten for Plugfill of High Aspect Ratio Contacts," Presentation made at Semicon Korea, 9 pages.
Diawara, Y et al. (1993) "Rapid thermal annealing for reducing stress in tungsten x-ray mask absorber," http://dx.doi.org/10.1116/1.586673, Journal of Vacuum Science & Technology B 11:296-300 (per table of contents of journal).
Elam et al. (2001) "Nucleation and Growth During Tungsten Atomic Layer Deposition on SiO2 Surfaces," Thin Solid Films, 13pp.
Fair, James A. (1983) Presentation by Inventor "Chemical Vapor Deposition of Refractory Metal Silicides," GENUS Incorporated, 27 pp.
George et al. (1996) "Surface Chemistry for atomic Layer Growth", J. Phys. Chem, 100(31):13121-13131.
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf.], Materials Transactions, 43(7):1585-1592.
Habuka, Hitoshi (2010) "Advance of Atomic Layer Deposition in Semiconductor Materials Manufacturing Process: Cleaning Technology for Thin Film Formation Reactor" Department of Chemical and Energy Engineering, Yokohama National University, 79, 5 Tokiwadai Hodogaya-ku Kanagawa 240, 8501, Japan.
Hoover, Cynthia (Jul. 2007) "Enabling Materials for Contact Metallization," Praxair Electronic Materials R&D, pp. 1-16.
International Preliminary Report on Patentability dated Jun. 24, 2021 issued in Application No. PCT/US2019/066301.
International Preliminary Report on Patentability dated Nov. 12, 2020 in Application No. PCT/US2019/030712.
International Preliminary Report on Patentability dated Oct. 21, 2021, in application No. PCT/US2020/027107.
International Search Report and Written Opinion dated Apr. 13, 2020 issued in Application No. PCT/US2019/066301.
International Search Report and Written Opinion dated Aug. 19, 2019 in Application No. PCT/US2019/030712.
International Search Report and Written Opinion dated Jul. 24, 2020 issued in Application No. PCT/US2020/027107.
Jamie, W. et al., "In Situ Atomic Layer Deposition and Electron Tunneling Characterization of Monolayer $Al_2O_3$ on Fe for Magnetic Tunnel Junctions", AIP Advances, 2018, vol. 8, No. 125218, pp. 1-9.
Japanese First Office Action dated Jun. 24, 2020 issued in Application No. JP 2016-105216.
Japanese First Office Action dated Jun. 3, 2020 issued in Application No. JP 2016-104837.
Japanese Notification of Reasons for Rejection dated Dec. 20, 2016 issued in Application No. JP 2015-503547.
Japanese Office Action dated Dec. 3, 2013 issued in Application No. JP 2011-525228.
Japanese Office Action dated Jul. 29, 2014 issued in Application No. JP 2010-093544.
Japanese Office Action dated Jun. 17, 2014 issued in Application No. JP 2010-055163.
Japanese Office Action dated Mar. 4, 2014 issued in Application No. JP 2010-093522.
Japanese Office Action dated May 7, 2013, issued in Application No. JP 2008-310322.
Japanese Office Action dated Sep. 3, 2013, issued in Application No. JP 2008-325333.
Japanese Second Office Action dated Apr. 5, 2021 issued in Application No. JP 2016-104837.
Japanese Second Office Action dated Mar. 3, 2021 issued in Application No. JP 2016-105216.
Johnson, R.W., Hultqvist, A., Bent, S.F., "A brief review of atomic layer deposition: from fundamentals to applications", Materials today, (Jun. 1, 2014), 17(5):236-46.
JP Office Action dated Nov. 24, 2021, in Application No. JP20160104837 with English translation.
Kim, S. et al., "Effects of $B_2H_6$ Pretreatment on ALD of W Film Using a Sequential Supply of $WF_6$ and $SiH4$", Electrochemical and Solid-State Letters, The Electrochemical Society, 2005, vol. 8, No. 10, pp. C155-C159.
Klaus et al. (2000) "Atomic layer deposition of tungsten using sequential surface chemistry with a sacrificial stripping reaction," Thin Solid Films 360:145-153.

(56) References Cited

OTHER PUBLICATIONS

Klaus et al. (2000) "Atomically Controlled Growth of Tungsten and Tungsten Nitride Using Sequential Surface Reactions," Applied Surface Science, pp. 162-163, 479-491.
Korean Decision for Grant dated Apr. 7, 2020 issued in Application No. KR 10-2020-7000199.
Korean Decision for Grant dated Nov. 5, 2021 issued in Application No. KR 10-2014-0192527.
Korean Final Rejection dated Jun. 30, 2021 issued in Application No. KR 10-2014-0192527.
Korean Final Rejection Office Action dated Apr. 27, 2021 issued in Application No. KR 10-2016-0064157.
Korean First Notification of Provisional Rejection, dated Dec. 8, 2010, issued in Application No. KR 2004-0036346.
Korean First Office Action dated Apr. 18, 2019 issued in Application No. KR 10-2014-7030125.
Korean First Office Action dated Aug. 2, 2021, issued in Application No. KR 10-2014-0184759.
Korean First Office Action dated Aug. 30, 2019 issued in Application No. KR 10-2013-0075854.
Korean First Office Action dated Aug. 6, 2020 issued in Application No. KR 10-2014-0044410.
Korean First Office Action dated Dec. 21, 2020 issued in Application No. KR 10-2014-0192527.
Korean First Office Action dated Jan. 1, 2019 issued in Application No. KR 10-2013-0089130.
Korean First Office Action dated Jul. 10, 2015 issued in Application No. KR 10-2014-0090283.
Korean First Office Action dated Jul. 12, 2021 issued in Application No. KR 10-2021-0063953.
Korean First Office Action dated Nov. 25, 2020 issued in Application No. KR 10-2020-0124056.
Korean First Office Action dated Oct. 1, 2020 issued in Application No. KR 10-2016-0064157.
Korean First Office Action dated Sep. 24, 2019 issued in Application No. KR 10-2013-0089834.
Korean First Office Action [No Translation] dated Oct. 21, 2019 issued in Application No. KR 10-2013-0108151.
Korean Notification of Provisional Rejection dated Jul. 17, 2012, issued in Application No. KR 2010-0087997.
Korean Office Action dated Jul. 19, 2013 issued in Application No. KR 2011-7004322.
Korean Office Action dated Jul. 28, 2021 issued in Application No. KR 10-2016-0064157.
Korean Office Action, dated Jun. 13, 2011, issued in Application No. KR 2011-0032098.
Korean Office Action dated Jun. 17, 2014 issued in Application No. KR 10-2013-7027117.
Korean Office Action dated Jun. 21, 2021 issued in Application No. KR 10-2020-0124056.
Korean Office Action dated Jun. 28, 2020 issued in Application No. KR 10-2020-0141428.
Korean Office Action dated Mar. 21, 2013 issued in Application No. KR 10-2010-0024905.
Korean Office Action, dated Mar. 28, 2013, issued in Application No. KR 10-2007-0012027.
Korean Office Action dated Mar. 4, 2013 in Application No. KR 2010-0035449.
Korean Office Action, dated Nov. 24, 2010, issued in Application No. KR 10-2004-0013210.
Korean Office Action dated Nov. 30, 2020 issued in Application No. KR 10-2020-0141428.
Korean Office Action dated Nov. 4, 2013 issued in Application No. KR 10-2013-7027117.
Korean Office Action dated Sep. 6, 2012 issued in Application No. KR 2011-7004322.
Korean Second Office Action dated Apr. 7, 2020 issued in Application No. KR 10-2013-0075854.
Korean Second Office Action dated Jan. 25, 2014 in Application No. KR 10-2010-0035453.
Korean Second Office Action dated Mar. 11, 2020 issued in Application No. KR 10-2013-0108151.
Korean Third Office Action dated Jun. 25, 2020 issued in Application No. KR 10-2013-0108151.
Korean Third Office Action dated Jun. 29, 2020 issued in Application No. KR 10-2013-0075854.
KR Office Action dated Dec. 14, 2021, in application No. 20210063953 with English translation.
KR Final Rejection dated Oct. 5, 2021, in application No. KR1020200141428 with English translation.
KR Office Action dated Jan. 11, 2022, in KR Application No. 10-2022-0000825 with English translation.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], Thin Solid Films, 370:114-121.
Lai, Ken K. and Lamb, H. Henry (1995) "Precursors for Organometallic Chemical Vapor Deposition of Tungsten Carbide Films," Chemistry Material, 7(12):2284-2292.
Lee et al. (Jan. 21, 2003) "Pulsed Deposition of Ultra Thin Tungsten and its Application for Plugfill of High Aspect Ratio Contacts," Abstract, 1 page.
Li et al. (2002) "Deposition of WNxCy-Thin Films by ALCVDTM Method for Diffusion Barriers in Metallization," IITC Conference Report, 3 pp.
Li, Z. et al., "Atomic Layer Deposition of Ultrathin Copper Metal Films from a Liquid Copper(I) Amidinate Precursor", Journal of The Electrochemical Society, 2006, vol. 153, No. 11, pp. C787-C794.
Lim, B. et al., "Atomic Layer Deposition of Transition Metals", Nature Materials, 2003, vol. 2, pp. 749-754.
Manik. P, et al. (2012) "Fermi-level unpinning and low resistivity in contacts to n-type Ge with a thin ZnO interfacial layer," App. Phys. Lett. 101:182105-5.
Notice of Allowance dated Dec. 3, 2012, issued in U.S. Appl. No. 13/095,734.
PCT International Preliminary Report on Patentability and Written Opinion, dated Mar. 10, 2011, issued in PCT/US2009/055349.
PCT International Preliminary Report on Patentability and Written Opinion, dated Oct. 9, 2014, issued in PCT/US2013/034167.
PCT International Search Report and Written Opinion, dated Apr. 12, 2010, issued in PCT/US2009/055349.
PCT International Search Report and Written Opinion, dated Jul. 26, 2013, issued in PCT/US2013/034167.
PCT Search Report and Written Opinion, dated Jan. 19, 2005, issued in PCT/US2004/006940.
Saito et al. (2001) "A Novel Copper Interconnection Technology Using Self Aligned Metal Capping Method," IEEE, 3pp.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], Journal of Applied Physics, 58(11):4194-4199.
Taiwan Examination Report dated Dec. 26, 2016 issued in Application No. TW 102123248.
Taiwan Examination Report, dated Jun. 22, 2017, issued in Application No. TW 103113287.
Taiwan Examination Report dated Mar. 16, 2017 issued in Application No. TW 102132433.
Taiwan Examination Report dated Oct. 26, 2016 issued in Application No. TW 102126696.
Taiwan Examination Report dated Oct. 26, 2016 issued in Application No. TW 102126976.
Taiwan First Office Action dated Jun. 27, 2018 issued in Application No. TW 103145125.
Taiwan First Office Action [Reissued] dated Jun. 20, 2018, issued in Application No. TW 103144260.
Taiwan Office Action and Search Report dated Feb. 12, 2015 issued in Application No. TW 099130354.
Taiwan Office Action dated Aug. 4, 2015 issued in Application No. TW 099111859.
Taiwan Office Action dated Dec. 27, 2014 issued in Application No. TW 099111860.

(56) References Cited

OTHER PUBLICATIONS

Taiwan Office Action dated Jan. 10, 2017 issued in Application No. TW 105105984.
Taiwan Office Action dated Jun. 8, 2015 issued in Application No. TW 099107504.
Taiwan Office Action dated Oct. 25, 2016 issued in Application No. TW 102110947.
Taiwan Office Action (Rejection Decision) dated Oct. 28, 2015 issued in Application No. TW 099130354.
Taiwan Search Report dated Nov. 30, 2016 issued in Application No. TW 099130354.
Taiwanese First Office Action dated Nov. 13, 2019 issued in Application No. TW 105116371.
Taiwanese First Office Action dated Nov. 25, 2019 issued in Application No. TW 105116363.
Taiwanese Second Office Action dated Aug. 19, 2020 issued in Application No. TW 105116371.
Taiwanese Third Office Action dated Mar. 16, 2021 issued in Application No. TW 105116371.
US Final Office Action, dated Apr. 14, 2017, issued in U.S. Appl. No. 14/965,806.
US Final Office Action, dated Apr. 28, 2009, issued in U.S. Appl. No. 11/782,570.
US Final Office Action, dated Apr. 30, 2012, issued in U.S. Appl. No. 12/755,248.
US Final Office Action, dated Dec. 28, 2005, issued in U.S. Appl. No. 10/815,560.
US Final Office Action, dated Dec. 30, 2010, issued in U.S. Appl. No. 11/963,698.
US Final Office Action, dated Dec. 9, 2009, issued in U.S. Appl. No. 11/963,698.
US Final Office Action, dated Feb. 14, 2014, issued in U.S. Appl. No. 13/560,688.
US Final Office Action, dated Feb. 25, 2009, issued in U.S. Appl. No. 11/349,035.
US Final Office Action, dated Feb. 26, 2009, issued in U.S. Appl. No. 11/265,531.
US Final Office Action, dated Feb. 7, 2011, issued in U.S. Appl. No. 12/202,126.
US Final Office Action, dated Jan. 13, 2010, issued in U.S. Appl. No. 12/030,645.
US Final Office Action, dated Jan. 14, 2016, issued in U.S. Appl. No. 13/949,092.
US Final Office Action, dated Jan. 20, 2017, issued in U.S. Appl. No. 14/723,275.
US Final Office Action, dated Jan. 26, 2010 from U.S. Appl. No. 11/951,236.
US Final Office Action, dated Jul. 14, 2005, issued in U.S. Appl. No. 10/649,351.
US Final Office Action, dated Jul. 17, 2015, issued in U.S. Appl. No. 14/502,817.
US Final Office Action, dated Jul. 2, 2014, issued in U.S. Appl. No. 13/020,748.
US Final Office Action, dated Jul. 23, 2010, issued in U.S. Appl. No. 12/030,645.
US Final Office Action, dated Jul. 25, 2016, issued in U.S. Appl. No. 14/738,685.
US Final Office Action, dated Jun. 15, 2011, issued in U.S. Appl. No. 12/636,616.
US Final Office Action, dated Jun. 2, 2015, issued in U.S. Appl. No. 14/097,160.
US Final Office Action dated Mar. 21, 2019, issued in U.S. Appl. No. 15/415,800.
US Final Office Action, dated May 17, 2006, issued in U.S. Appl. No. 10/984,126.
US Final Office Action, dated May 18, 2017, issued in U.S. Appl. No. 13/949,092.
US Final Office Action, dated May 31, 2016, issued in U.S. Appl. No. 14/135,375.
US Final Office Action, dated May 7, 2010, issued in U.S. Appl. No. 12/202,126.
US Final Office Action, dated Nov. 16, 2012, issued in U.S. Appl. No. 13/020,748.
US Final Office Action, dated Nov. 17, 2011, issued in U.S. Appl. No. 12/829,119.
US Final Office Action, dated Nov. 20, 2009, issued in U.S. Appl. No. 11/349,035.
US Final Office Action, dated Nov. 26, 2013, issued in U.S. Appl. No. 13/633,798.
US Final Office Action, dated Nov. 5, 2014, issued in U.S. Appl. No. 13/633,502.
US Final Office Action, dated Oct. 16, 2014, issued in U.S. Appl. No. 13/862,048.
US Final Office Action, dated Oct. 19, 2010, issued in U.S. Appl. No. 12/407,541.
US Final Office Action, dated Sep. 12, 2012, issued in U.S. Appl. No. 12/755,259.
US Final Office Action, dated Sep. 29, 2015, issued in U.S. Appl. No. 14/135,375.
U.S. Non-Final Office Action dated Dec. 15, 2021 in U.S. Appl. No. 17/250,014.
U.S. Non-Final Office Action dated Sep. 21, 2021, in U.S. Appl. No. 16/638,430.
US Notice of Allowance and Fee Due, dated Jan. 24, 2011, issued in U.S. Appl. No. 12/030,645.
US Notice of Allowance,, dated Apr. 24, 2007, issued in U.S. Appl. No. 10/815,560.
US Notice of Allowance, dated Apr. 28, 2015, issued in U.S. Appl. No. 13/862,048.
US Notice of Allowance, dated Apr. 6, 2010, issued in U.S. Appl. No. 11/951,236.
US Notice of Allowance, dated Aug. 25, 2006, issued in U.S. Appl. No. 10/984,126.
US Notice of Allowance, dated Aug. 3, 2016, issued in U.S. Appl. No. 13/851,885.
US Notice of Allowance, dated Aug. 7, 2012, issued in U.S. Appl. No. 12/829,119.
US Notice of Allowance, dated Dec. 14, 2016, issued in U.S. Appl. No. 13/851,885.
US Notice of Allowance dated Dec. 24, 2013, issued in U.S. Appl. No. 12/723,532.
US Notice of Allowance, dated Jan. 12, 2018, issued in U.S. Appl. No. 13/949,092.
US Notice of Allowance, dated Jan. 19, 2005, issued in U.S. Appl. No. 10/435,010.
US Notice of Allowance, dated Jan. 19, 2018, issued in U.S. Appl. No. 15/398,462.
US Notice of Allowance, dated Jan. 20, 2017, issued in U.S. Appl. No. 14/989,444.
US Notice of Allowance, dated Jan. 22, 2015, issued in U.S. Appl. No. 13/928,216.
U.S. Notice of Allowance dated Jan. 25, 2022, in U.S. Appl. No. 16/638,430.
US Notice of Allowance, dated Jul. 10, 2013, issued in U.S. Appl. No. 12/755,259.
US Notice of Allowance, dated Jul. 21, 2006, issued in U.S. Appl. No. 10/649,351.
US Notice of Allowance, dated Jul. 25, 2011, issued in U.S. Appl. No. 12/363,330.
US Notice of Allowance, dated Jun. 17, 2015, issued in U.S. Appl. No. 13/862,048.
US Notice of Allowance, dated Jun. 2, 2015, issued in U.S. Appl. No. 14/173,733.
US Notice of Allowance, dated Jun. 30, 2011, issued in U.S. Appl. No. 12/538,770.
US Notice of Allowance, dated Jun. 7, 2013, issued in U.S. Appl. No. 12/202,126.
US Notice of Allowance, dated Mar. 12, 2003, issued in U.S. Appl. No. 09/975,074.
US Notice of Allowance, dated Mar. 2, 2010, issued in U.S. Appl. No. 11/349,035.

(56) References Cited

OTHER PUBLICATIONS

US Notice of Allowance, dated Mar. 2, 2012, issued in U.S. Appl. No. 12/556,490.
US Notice of Allowance, dated Mar. 2, 2015, issued in U.S. Appl. No. 13/633,502.
US Notice of Allowance, dated Mar. 24, 2017, issued in U.S. Appl. No. 13/851,885.
US Notice of Allowance, dated May 23, 2014, issued in U.S. Appl. No. 13/633,798.
US Notice of Allowance, dated May 4, 2009, issued in U.S. Appl. No. 11/265,531.
US Notice of Allowance, dated May 4, 2017, issued in U.S. Appl. No. 14/723,275.
US Notice of Allowance, dated Nov. 17, 2009, issued in U.S. Appl. No. 11/305,368.
US Notice of Allowance, dated Nov. 18, 2016, issued in U.S. Appl. No. 14/723,270.
US Notice of Allowance dated Nov. 29, 2012, issued in U.S. Appl. No. 13/244,016.
US Notice of Allowance, dated Nov. 4, 2014, issued in U.S. Appl. No. 13/560,688.
US Notice of Allowance, dated Oct. 13, 2016, issued in U.S. Appl. No. 14/738,685.
US Notice of Allowance, dated Oct. 25, 2016, issued in U.S. Appl. No. 14/135,375.
US Notice of Allowance, dated Oct. 4, 2012, issued in U.S. Appl. No. 13/276,170.
US Notice of Allowance, dated Oct. 7, 2004, issued in U.S. Appl. No. 10/435,010.
US Notice of Allowance, dated Sep. 14, 2005, issued in U.S. Appl. No. 10/690,492.
US Notice of Allowance, dated Sep. 17, 2009, issued in U.S. Appl. No. 11/782,570.
US Notice of Allowance, dated Sep. 19, 2011, issued in U.S. Appl. No. 12/407,541.
US Notice of Allowance, dated Sep. 2, 2011, issued in U.S. Appl. No. 11/963,698.
US Notice of Allowance, dated Sep. 25, 2015, issued in U.S. Appl. No. 14/502,817.
US Notice of Allowance, dated Sep. 30, 2011, issued in U.S. Appl. No. 12/636,616.
US Notice of Allowance dated Sep. 4, 2013 issued in U.S. Appl. No. 12/755,259.
US Notice of Allowance, dated Sep. 6, 2019, issued in U.S. Appl. No. 15/958,662.
US Notice of Allowance, dated Sep. 9, 2015, issued in U.S. Appl. No. 14/097,160.
US Notice of Allowance (Supplemental Notice of Allowability), dated Apr. 16, 2015, issued in U.S. Appl. No. 13/633,502.
US Office Action, dated Apr. 16, 2012, issued in U.S. Appl. No. 13/276,170.
US Office Action, dated Apr. 17, 2006, issued in U.S. Appl. No. 10/815,560.
US Office Action, dated Apr. 19, 2012, issued in U.S. Appl. No. 12/829,119.
US Office Action, dated Apr. 3, 2009, issued in U.S. Appl. No. 11/305,368.
US Office Action, dated Apr. 4, 2019, issued in U.S. Appl. No. 15/958,662.
US Office Action, dated Apr. 7, 2014, issued in U.S. Appl. No. 13/633,502.
US Office Action, dated Aug. 21, 2008, issued in U.S. Appl. No. 11/265,531.
US Office Action, dated Aug. 5, 2009, issued in U.S. Appl. No. 11/951,236.
US Office Action, dated Aug. 6, 2012, issued in U.S. Appl. No. 13/095,734.
US Office Action, dated Dec. 11, 2014, issued in U.S. Appl. No. 14/173,733.
US Office Action dated Dec. 18, 2012, issued in U.S. Appl. No. 12/723,532.
US Office Action, dated Dec. 18, 2014, issued in U.S. Appl. No. 14/097,160.
US Office Action, dated Dec. 18, 2014, issued in U.S. Appl. No. 14/502,817.
US Office Action, dated Dec. 23, 2014, issued in U.S. Appl. No. 13/851,885.
US Office Action, dated Dec. 30, 2005, issued in U.S. Appl. No. 10/649,351.
US Office Action, dated Feb. 1, 2016, issued in U.S. Appl. No. 14/723,275.
US Office Action, dated Feb. 15, 2013, issued in U.S. Appl. No. 12/755,248.
US Office Action, dated Feb. 16, 2012, issued in U.S. Appl. No. 12/755,259.
US Office Action, dated Feb. 24, 2014, issued in U.S. Appl. No. 13/020,748.
US Office Action, dated Feb. 8, 2005, issued in U.S. Appl. No. 10/649,351.
US Office Action, dated Jan. 12, 2016, issued in U.S. Appl. No. 14/738,685.
US Office Action, dated Jan. 21, 2016, issued in U.S. Appl. No. 14/135,375.
US Office Action, dated Jan. 25, 2011, issued in U.S. Appl. No. 12/636,616.
US Office Action, dated Jan. 7, 2013, issued in U.S. Appl. No. 12/202,126.
US Office Action, dated Jul. 12, 2005, issued in U.S. Appl. No. 10/815,560.
US Office Action, dated Jul. 12, 2016, issued in U.S. Appl. No. 14/723,270.
US Office Action, dated Jul. 17, 2002, issued in U.S. Appl. No. 09/975,074.
US Office Action dated Jul. 18, 2013, issued in U.S. Appl. No. 12/723,532.
US Office Action, dated Jul. 20, 2017, issued in U.S. Appl. No. 15/398,462.
US Office Action, dated Jul. 26, 2010 issued in Application No. 12/202, 126.
US Office Action, dated Jul. 28, 2016, issued in U.S. Appl. No. 14/723,275.
US Office Action, dated Jul. 7, 2016, issued in U.S. Appl. No. 14/989,444.
US Office Action, dated Jun. 11, 2009, issued in U.S. Appl. No. 11/963,698.
US Office Action, dated Jun. 11, 2010, issued in U.S. Appl. No. 11/963,698.
US Office Action, dated Jun. 14, 2011, issued in U.S. Appl. No. 12/556,490.
US Office Action, dated Jun. 14, 2013, issued in U.S. Appl. No. 13/633,798.
US Office Action, dated Jun. 20, 2013, issued in U.S. Appl. No. 13/560,688.
US Office Action, dated Jun. 22, 2004, issued in U.S. Appl. No. 10/435,010.
US Office Action, dated Jun. 24, 2009, issued in U.S. Appl. No. 12/030,645.
US Office Action, dated Jun. 27, 2008, issued in U.S. Appl. No. 11/305,368.
US Office Action, dated Jun. 30, 2011, issued in U.S. Appl. No. 12/829,119.
US Office Action, dated Jun. 4, 2009, issued in U.S. Appl. No. 11/349,035.
US Office Action, dated Mar. 23, 2005, issued in U.S. Appl. No. 10/690,492.
US Office Action, dated Mar. 6, 2012, issued in U.S. Appl. No. 13/244,016.
US Office Action, dated May 10, 2012, issued in U.S. Appl. No. 13/020,748.
US Office Action, dated May 13, 2011, issued in U.S. Appl. No. 12/755,248.

(56) References Cited

OTHER PUBLICATIONS

US Office Action, dated May 2, 2011, issued in U.S. Appl. No. 12/407,541.
US Office Action, dated May 29, 2015, issued in U.S. Appl. No. 13/949,092.
US Office Action, dated May 3, 2010, issued in U.S. Appl. No. 12/407,541.
US Office Action, dated May 30, 2014, issued in U.S. Appl. No. 13/862,048.
US Office Action, dated May 6, 2015, issued in U.S. Appl. No. 14/135,375.
US Office Action, dated Nov. 23, 2005, issued in U.S. Appl. No. 10/984,126.
US Office Action, dated Nov. 23, 2010, issued in U.S. Appl. No. 12/538,770.
US Office Action, dated Oct. 16, 2008, issued in U.S. Appl. No. 11/349,035.
US Office Action dated Oct. 21, 2009, issued in U.S. Appl. No. 12/202,126.
US Office Action, dated Oct. 24, 2018, issued in U.S. Appl. No. 15/415,800.
US Office Action, dated Oct. 28, 2011, issued in U.S. Appl. No. 12/755,248.
US Office Action, dated Sep. 11, 2017, issued in U.S. Appl. No. 14/965,806.
US Office Action, dated Sep. 18, 2014, issued in U.S. Appl. No. 13/928,216.
US Office Action, dated Sep. 19, 2016, issued in U.S. Appl. No. 13/949,092.
US Office Action, dated Sep. 2, 2016, issued in U.S. Appl. No. 14/965,806.
US Office Action, dated Sep. 28, 2006, issued in U.S. Appl. No. 10/815,560.
US Office Action, dated Sep. 29, 2008, issued in U.S. Appl. No. 11/782,570.
US Office Action Restriction/Election dated Sep. 9, 2021 issued in U.S. Appl. No. 17/250,014.
U.S. Appl. No. 13/758,928, Inventors Humayun et al., filed Feb. 4, 2013.
U.S. Appl. No. 17/601,918, Inventors Bowes et al., filed Oct. 6, 2021.
Wikipedia "Atomic layer deposition" [webpage] Mar. 25, 2020, pp. 1-9. retrieved from, URL: https://ja.wikipedia.org/w/index.php?title= Atomic Layer Deposition & oldid = 76757564.
Anonymous, "Lam Research enables next-generation memory with industry's first ALD process for low-fluorine tungsten fill" Semiconductor Digest News and Industry Trends for Solid State Technology, Aug. 2016, 2 Pages.
CN Office Action dated Feb. 14, 2023 in Application No. CN202080037670.4 with English translation.
CN Office Action dated Mar. 30, 2023, in Application No. CN202080027971.9 with English translation.
CN Office Action dated Oct. 11, 2022, in Application No. CN201910418672.7 with English translation.
Coventor Brochure "3D NAND: Challenges Beyond 96-Layer Memory Arrays", Oct. 12, 2018, pp. 1-4.
Dominique, S. et al., "An alternative to Tungsten in 3D-NAND technology", IEEE International Interconnect Technology Conference (IITC), 2021, pp. 1-3.
International Preliminary Report on Patentability and written opinion dated Sep. 15, 2022, in PCT Application No. PCT/US2021/020748.
International Preliminary Report on Patentability dated Dec. 2, 2021, issued in PCT/US2020/033461.
International Preliminary Report on Patentability dated Feb. 9, 2023 in PCT Application No. PCT/US2020/070325.
International Preliminary Report on Patentability dated Feb. 24, 2022 in PCT Application No. PCT/US2020/070394.
International Search Report and Written Opinion dated Apr. 27, 2021 in PCT Application No. PCT/US2020/070325.
International Search Report and Written Opinion dated Jun. 18, 2021, in PCT Application No. PCT/US2021/020748.
International Search Report and Written Opinion dated Nov. 27, 2020, in PCT Application No. PCT/US2020/070394.
International Search Report and Written Opinion dated Sep. 4, 2020 in PCT Application No. PCT/US2020/033461.
Japanese Office Action dated Feb. 14, 2023 issued in Application No. JP2020-508312 with English translation.
JP Office Action dated Jul. 19, 2022, in Application No. JP2020-508312 with English translation.
JP Office Action dated Jun. 6, 2023 in Application No. JP2020561743 With English translation.
JP Office Action dated May 31, 2022, in Application No. JP2016-104837 with English translation.
Kim, K et al., "Simulation of Residual Stress and Its Impact on a Poly-Silicon Channel for Three-Dimensional, Stacked, Vertical-NAND Flash Memories", Journal of the Korean Physical Society, 2017, vol. 70 (12), pp. 1041-1048.
KR Office Action dated Apr. 19, 2022, in application No. KR20140184759 with English Translation.
KR Office Action dated Dec. 1, 2022, in Application No. KR10-2022-0088685 with English translation.
KR Office Action dated Dec. 6, 2022, in Application No. KR10-2022-0106634 with English translation.
KR Office Action dated Feb. 11, 2023 in Application No. KR10-2016-0064757 with English translation.
KR Office Action dated Feb. 16, 2022, in Application No. KR1020160064157 with English translation.
KR Office Action dated Jun. 23, 2022, in Application No. KR10-2022-0015236 with English translation.
KR Office action dated May 25, 2022, in Application No. KR20210063953 with English Translation.
Lee, B et al., "ALD Tungsten Solves Capacity Challenges in 3D NAND Device Manufacturing", Lam Brochure, Jan. 2019, pp. 1-4.
TW Office Action dated Feb. 21, 2022, in Application No. TW107128141 with English translation.
U.S. Corrected Notice of Allowance dated May 5, 2022 in U.S. Appl. No. 16/638,430.
U.S. Non Final Office Action dated Mar. 16, 2023 in U.S. Appl. No. 17/312,594.
U.S. Notice of Allowance dated Jun. 7, 2022 in U.S. Appl. No. 17/250,014.
U.S. Notice of Allowance dated Sep. 16, 2022 in U.S. Appl. No. 17/250,014.
U.S. Appl. No. 17/907,959, inventors Birru et al., filed Aug. 29, 2022.
U.S. Appl. No. 18/003,137, inventors Schloss et al., filed Dec. 22, 2022.
U.S. Supplemental Notice of Allowance dated Dec. 14, 2022 in U.S. Appl. No. 17/250,014.
CN office action dated Jul. 26, 2023, in application No. CN202080037670.4 with English Translation.
CN Office Action dated Jun. 27, 2023, in Application No. CN201910418672.7 with English translation.
CN Office Action dated Mar. 10, 2023, in Application No. CN201880059689.1 with English translation.
International Search Report and Written Opinion dated Aug. 16, 2023, in Application No. PCT/US2023/017635.
JP Office Action dated Sep. 5, 2023, in Application No. JP2020-508312 with English translation.
Korean First Office Action dated Oct. 21, 2019 issued in Application No. KR 10-2013- 0108151 with English translation.
KR Office Action dated Aug. 22, 2023, in Application No. KR10-2022-0088685 with English translation.
KR Office Action dated Jul. 31, 2023, in Application No. KR10-2020-7007526 with English translation.
Mingxia L., et al., "Template-induced W Formation and Size Effect of Residual Stress and Resistivity in W Films," Wanfang Data Knowledge Service Platform, 2007, pp. 328-334.
SG Office Action dated Jul. 24, 2023, in application No. SG11202111277U.
SG Written Opinion dated Sep. 1, 2023 in Application No. SG11202201293W.

(56) References Cited

OTHER PUBLICATIONS

TW Office Action dated May 23, 2023 in Application No. TW111140395 with English Translation.
U.S. Final Office Action dated Sep. 25, 2023, in U.S. Appl. No. 17/312,594.
U.S. Non-Final Office Action dated Sep. 14, 2023, in U.S. Appl. No. 17/601,918.
U.S. Restriction requirement dated Jun. 15, 2023 in U.S. Appl. No. 17/601,918.
CN Office Action dated Nov. 17, 2023 in CN Application No. 202080057266.3, with English Translation.
CN Office Action dated Feb. 18, 2024 in CN Application No. 201880059689.1, with English Translation.
CN Office Action dated Jan. 9, 2024 in CN Application No. 201910418672.7 with English Translation.
CN Office Action dated Jan. 26, 2024 in CN Application No. 202080027971.9, with English Translation.
CN Office Action dated Oct. 7, 2023, in Application No. CN201880059689.1 with English translation.
CN Office Action dated Oct. 11, 2023, in application No. CN202110914064.2 with Englishtranslation.
JP Office Action dated Jan. 30, 2024 in JP Application No. JP2021-533642, with English Translation.
KR Final Office Action dated Oct. 31, 2023 in KR Application No. KR10-2016-0064757, with English Translation.
KR Office Action dated Mar. 11, 2024 in KR Application No. 10-2020-7007526.
U.S. Notice of Allowance dated Dec. 19, 2023 in U.S. Appl. No. 17/312,594.
U.S. Notice of Allowance dated Jan. 2, 2024 in U.S. Appl. No. 17/312,594.
U.S. Notice of Allowance dated Jan. 23, 2024 in U.S. Appl. No. 17/601,918.
U.S. Notice of Allowance dated Jan. 31, 2024 in U.S. Appl. No. 17/601,918.
U.S. Restriction Requirement dated Jun. 17, 2016 in U.S. Appl. No. 14/965,806.
JP Office Action dated Mar. 19, 2024 in JP Application No. 2020-561743, with English Translation.
KR Office Action dated Mar. 11, 2024 in KR Application No. 10-2020-7007526 with English translation.
U.S. Notice of Allowance dated Mar. 27, 2024 in U.S. Appl. No. 17/312,594.
U.S. Appl. No. 18/612,005, inventors Deng R, et al., filed on Mar. 21, 2024.

\* cited by examiner

Constrictions
151

TUNGSTEN DEPOSITION

INCORPORATED BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Tungsten (W) film deposition using chemical vapor deposition (CVD) techniques is an integral part of semiconductor fabrication processes. For example, tungsten films may be used as low resistivity electrical connections in the form of horizontal interconnects, vias between adjacent metal layers, and contacts between a first metal layer and the devices on a silicon substrate. Tungsten films may also be used in various memory applications, including in formation of buried wordline (bWL) architectures for dynamic random access memory (DRAM), word lines for 3D NAND, and logic applications. However, the continued decrease in feature size and film thickness brings various challenges including deposition of films having good step coverage.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect of the disclosure relates to a method including providing a substrate including a feature in a chamber; depositing a tungsten nucleation layer in the feature by performing one or more cycles of an atomic layer deposition (ALD) process, where each cycle includes: flowing one or more boron-containing reducing agent doses in the chamber, flowing one or more silicon-containing reducing agent doses in the chamber, where the one or more boron-containing reducing agent doses and the one or more silicon-containing reducing agent doses are sequential reactant doses, and after flowing the one or more boron-containing reducing agent and one or more silicon-containing reducing agent doses in the chamber, flowing one or more tungsten-containing precursor pulses in the chamber.

In some embodiments, the feature is a wordline (WL) feature in a 3-D NAND structure, the 3-D NAND structure including vertically-oriented sidewalls, a plurality of openings in the sidewalls leading to a plurality of horizontally-oriented WL features. In some embodiments, the method further includes purging the chamber between sequential reactant doses. In some embodiments, the method further includes depositing a bulk tungsten layer on the tungsten nucleation layer. In some embodiments, the bulk tungsten layer is deposited by an atomic layer deposition process using hydrogen (H2) as a reducing agent. In some embodiments, each ALD cycle begins with a boron-containing reducing agent dose. In some embodiments, each ALD cycle begins with a silicon-containing reducing agent dose.

Another aspect of the disclosure relates to a method of filling a 3-D NAND structure. The method can include providing, in a chamber, a 3-D NAND structure including vertically-oriented sidewalls, a plurality of openings in the sidewalls leading to a plurality of horizontally-oriented wordline (WL) features; depositing a tungsten nucleation layer in the WL features by performing one or more cycles of an atomic layer deposition (ALD) process, where each cycle includes flowing one or more boron-containing reducing agent doses in the chamber, flowing one or more silane doses in the chamber; and after flowing the one or more boron-containing reducing agent and one or more silicon-containing reducing agent doses in the chamber, flowing one or more tungsten-containing precursor pulses in the chamber.

In some embodiments, the method further includes purging the chamber between sequential reactant doses. In some embodiments, the method further includes depositing a bulk tungsten layer on the tungsten nucleation layer. In some embodiments, the bulk tungsten layer is deposited by an atomic layer deposition process using hydrogen (H2) as a reducing agent. In some embodiments, each ALD cycle begins with a boron-containing reducing agent dose. In some embodiments, each ALD cycle begins with a silicon-containing reducing agent dose.

Another aspect relates to an apparatus including a process chamber comprising one or more process stations, each process station comprising a substrate support configured to hold a substrate; at least one outlet for coupling to a vacuum; one or more process gas inlets coupled to one or more process gas sources; and a controller for controlling operations in the apparatus, comprising machine-readable instructions for: flowing one or more boron-containing reducing agent doses in the chamber, flowing one or more silane doses in the chamber; and after flowing the one or more boron-containing reducing agent and one or more silicon-containing reducing agent doses in the chamber, flowing one or more tungsten-containing precursor pulses in the chamber.

According to various embodiments, the doses may be in the same or different stations.

These and other aspects are described below with reference to the Figures.

DETAILED DESCRIPTION

Described herein are methods of filling features with tungsten and related systems and apparatus. Examples of applications include logic and memory contact fill, DRAM buried wordline fill, vertically integrated memory gate/wordline fill, and 3-D integration with through-silicon vias (TSVs). The methods described herein can be used to fill vertical features, such as in tungsten vias, and horizontal features, such as vertical NAND (VNAND) wordlines, and The methods may be used for conformal and bottom-up or inside-out fill.

Figures 1A, 1B:
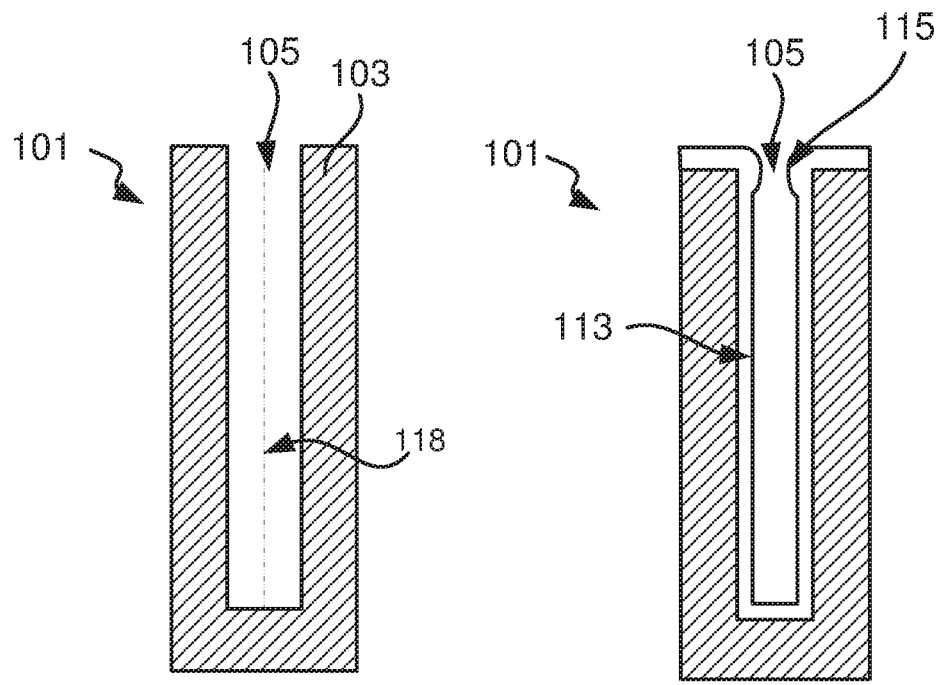
FIGS. 1A-1H show schematic examples of features that may be filled with tungsten according to various embodiments.
Figure 1D:
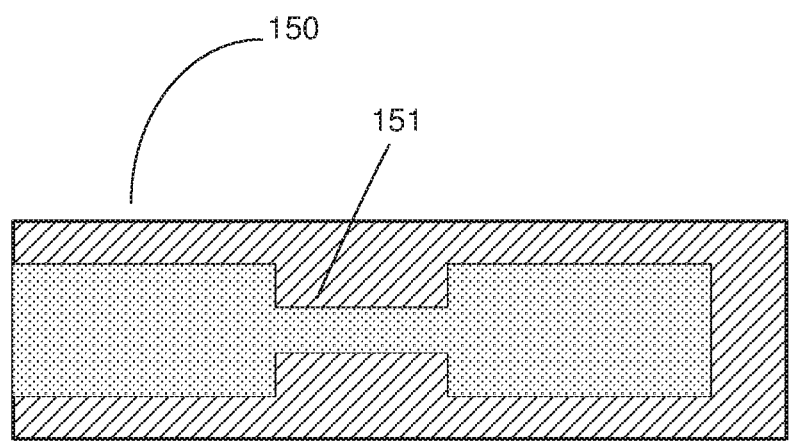
Figure 1C:
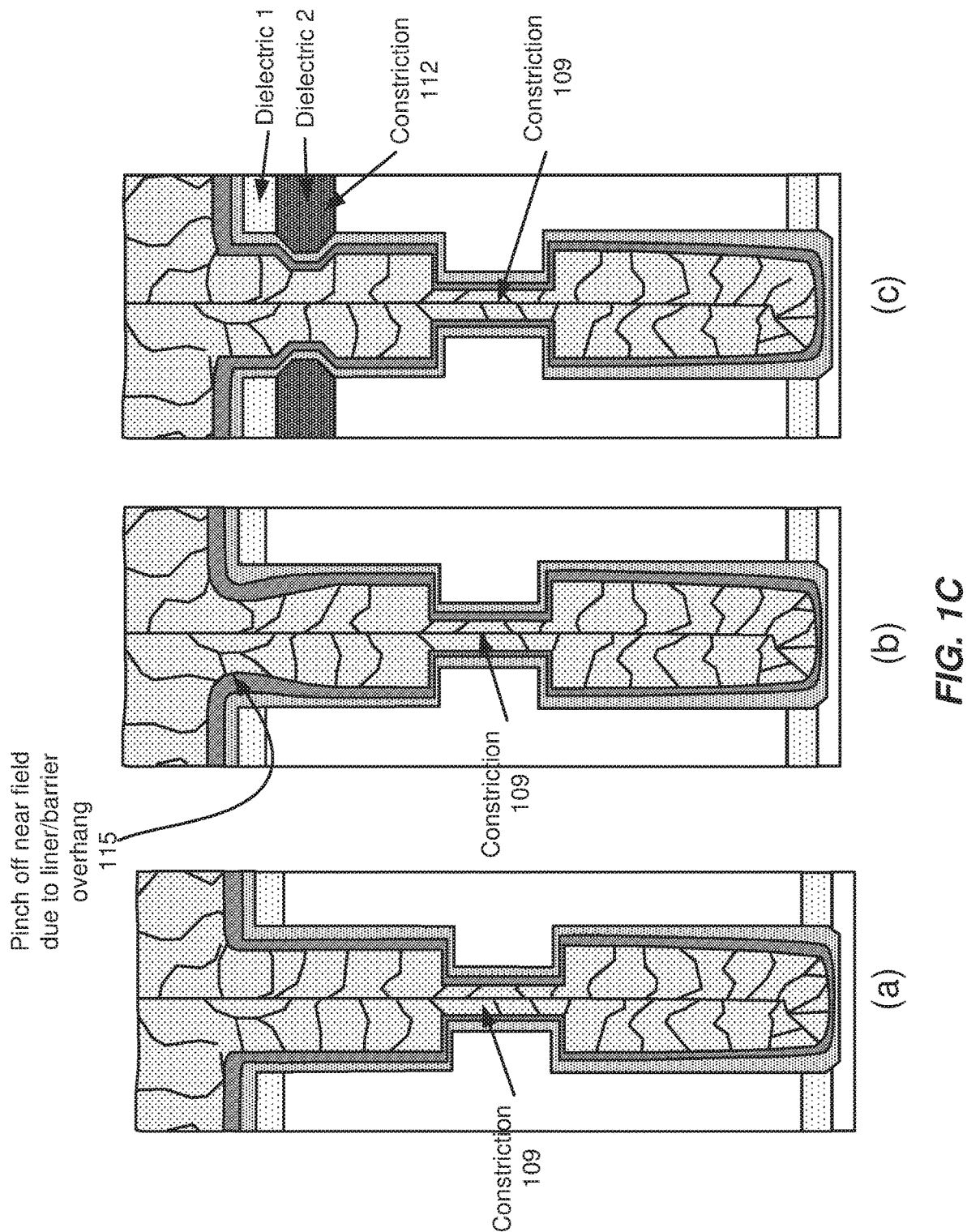

According to various embodiments, the features can be characterized by one or more of narrow and/or re-entrant openings, constrictions within the feature, and high aspect ratios. Examples of features that can be filled are depicted in FIGS. 1A-1C. FIG. 1A shows an example of a cross-sectional depiction of a vertical feature 101 to be filled with tungsten. The feature can include a feature hole 105 in a substrate 103. The substrate may be a silicon wafer, e.g., 200-mm wafer, 300-mm wafer, 450-mm wafer, including wafers having one or more layers of material such as dielectric, conducting, or semi-conducting material deposited thereon. In some embodiments, the feature hole 105 may have an aspect ratio of at least about 2:1, at least about 4:1, at least about 6:1 or higher. The feature hole 105 may also have a dimension near the opening, e.g., an opening diameter or line width, of between about 10 nm to 500 nm, for example between about 25 nm to 300 nm. The feature hole 105 can be referred to as an unfilled feature or simply a feature. The feature, and any feature, may be characterized in part by an axis 118 that extends through the length of the feature, with vertically-oriented features having vertical axes and horizontally-oriented features having horizontal axes.

FIG. 1B shows an example of a feature 101 that has a re-entrant profile. A re-entrant profile is a profile that narrows from a bottom, closed end, or interior of the feature to the feature opening. According to various embodiments, the profile may narrow gradually and/or include an overhang at the feature opening. FIG. 1B shows an example of the latter, with an under-layer 113 lining the sidewall or interior surfaces of the feature hole 105. The under-layer 113 can be for example, a diffusion barrier layer, an adhesion layer, a nucleation layer, a combination of thereof, or any other applicable material. The under-layer 113 forms an overhang 115 such that the under-layer 113 is thicker near the opening of the feature 101 than inside the feature 101.

In some embodiments, features having one or more constrictions within the feature may be filled. FIG. 1C shows examples of views of various filled features having constrictions. Each of the examples (a), (b) and (c) in FIG. 1C includes a constriction 109 at a midpoint within the feature. The constriction 109 can be, for example, between about 15 nm-20 nm wide. Constrictions can cause pinch off during deposition of tungsten in the feature using conventional techniques, with deposited tungsten blocking further deposition past the constriction before that portion of the feature is filled, resulting in voids in the feature. Example (b) further includes a liner/barrier overhang 115 at the feature opening. Such an overhang could also be a potential pinch-off point. Example (c) includes a constriction 112 further away from the field region than the overhang 115 in example (b). As described further below, methods described herein allow void-free fill as depicted in FIG. 1C.

Figure 1E:
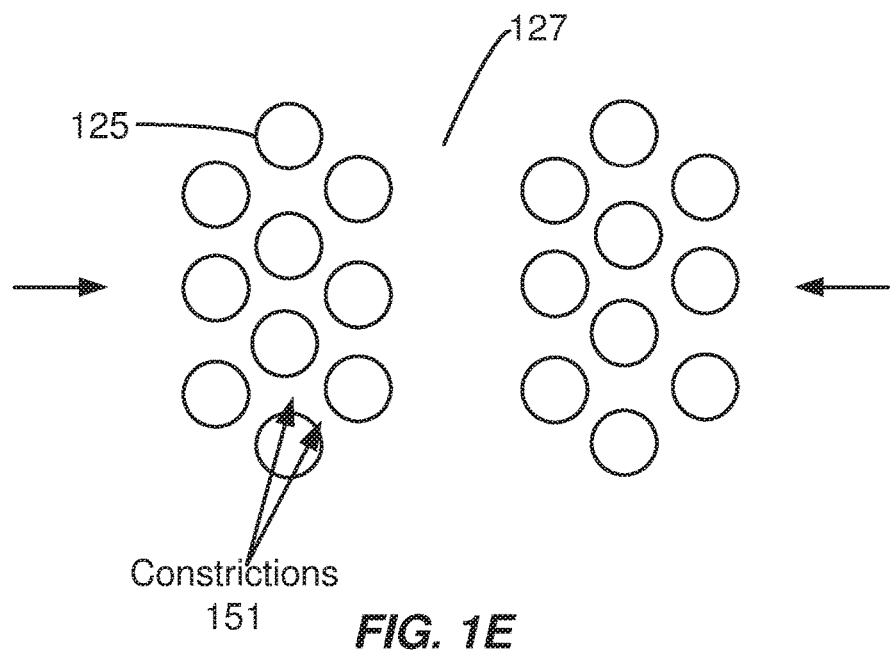
Figure 1F:
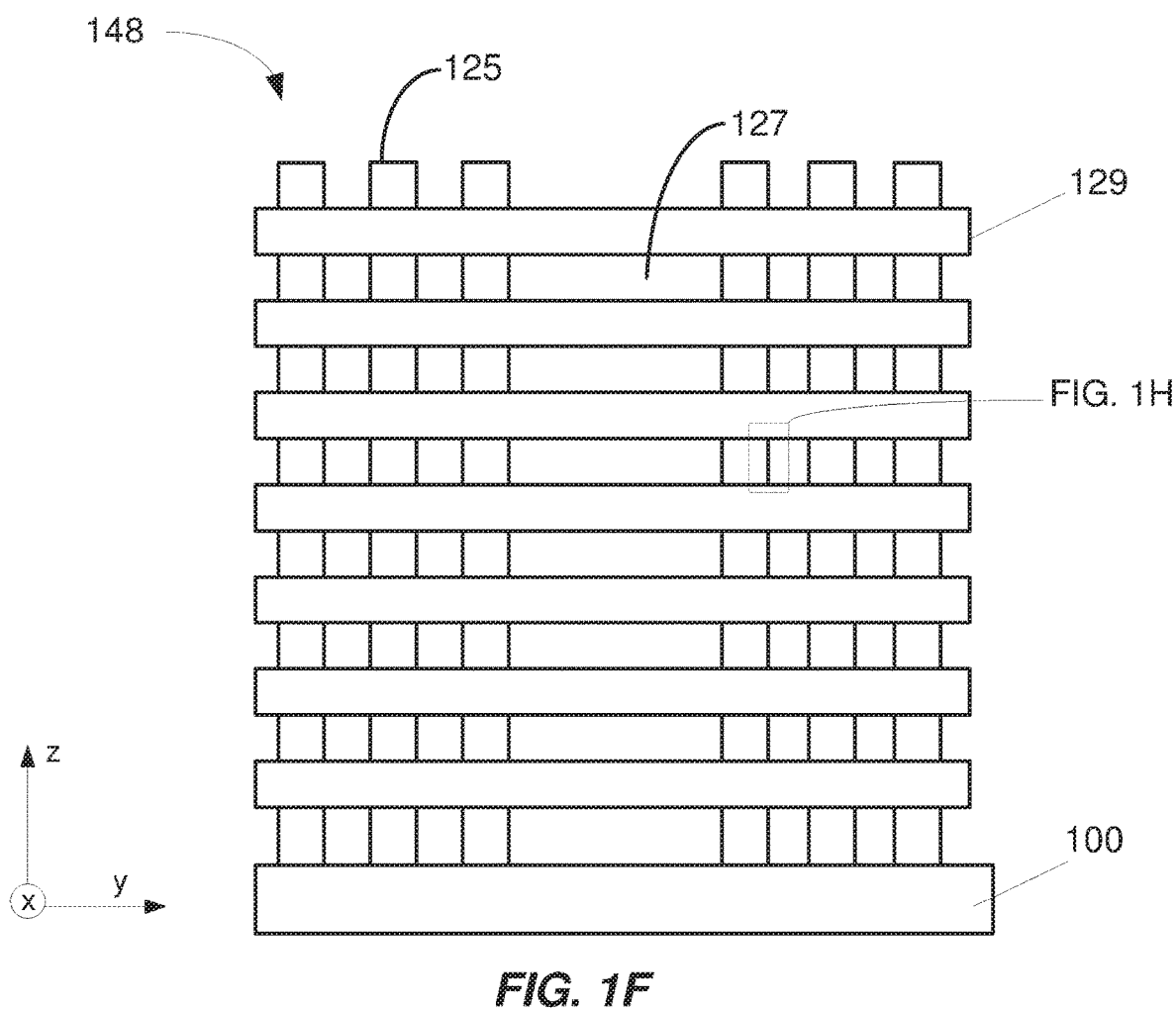

Horizontal features, such as in 3-D memory structures, can also be filled. FIG. 1D shows an example of a word line 150 in a VNAND structure 148 that includes a constriction 151. In some embodiments, the constrictions can be due to the presence of pillars in a VNAND or other structure. FIG. 1E, for example, shows a plan view of pillars 125 in a VNAND structure, with FIG. 1F showing a simplified schematic of a cross-sectional depiction of the pillars 125. Arrows in FIG. 1E represent deposition material; as pillars 125 are disposed between an area 127 and a gas inlet or other deposition source, adjacent pillars can result in constrictions that present challenges in void free fill of an area 127.

Figure 1G:
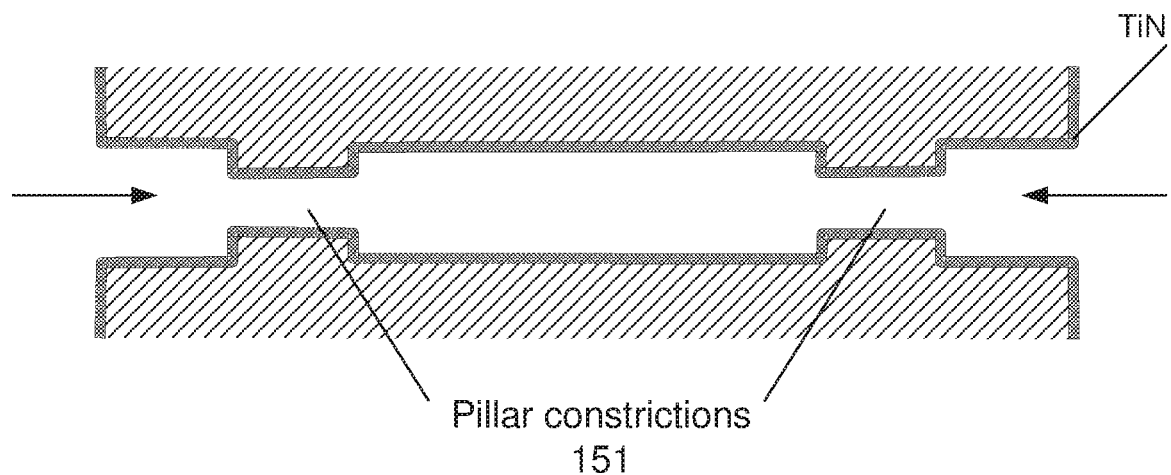
Figure 1H:
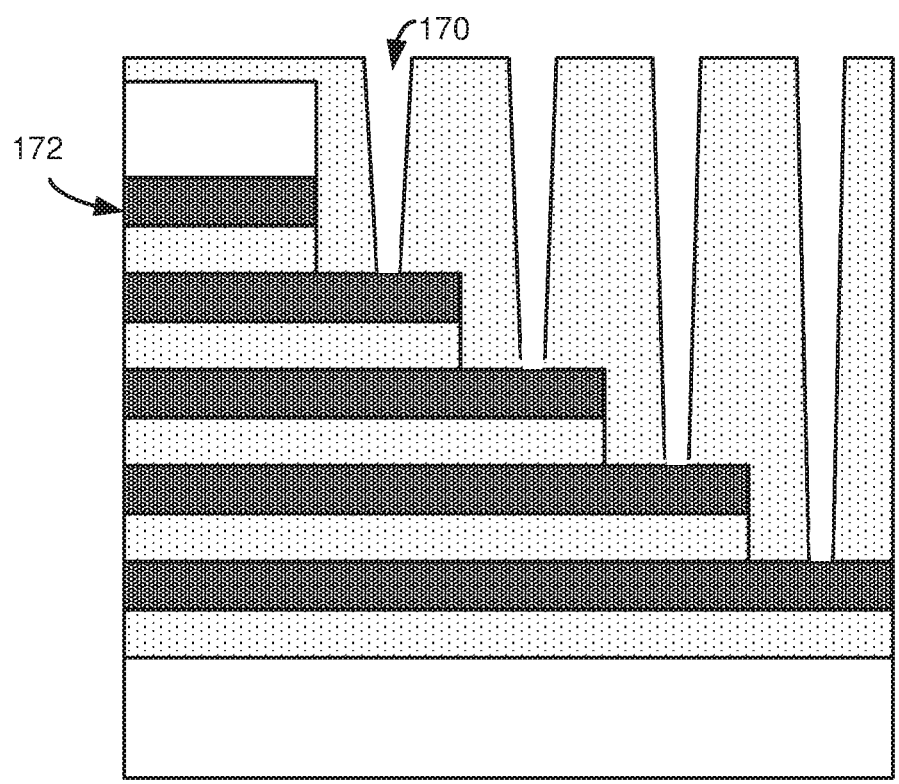

FIG. 1G provides another example of a view horizontal feature, for example, of a VNAND or other structure including pillar constrictions 151. The example in FIG. 1G is open-ended, with material to be deposited able to enter laterally from two sides as indicated by the arrows. (It should be noted that example in FIG. 1G can be seen as a 2-D rendering 3-D features of the structure, with the FIG. 1G being a cross-sectional depiction of an area to be filled and pillar constrictions shown in the figure representing constrictions that would be seen in a plan rather than cross-sectional view.) In some embodiments, 3-D structures can be characterized with the area to be filled extending along three dimensions (e.g., in the X, Y and Z-directions in the example of FIG. 1F), and can present more challenges for fill than filling holes or trenches that extend along one or two dimensions. For example, controlling fill of a 3-D structure can be challenging as deposition gasses may enter a feature from multiple dimensions. The methods may also be used to fill interconnects to tungsten wordlines as shown in FIG. 1H, where interconnect features 170 may be filled with tungsten to connect to the tungsten wordlines 172. Examples of feature fill for horizontally-oriented and vertically-oriented features are described below. It should be noted that in most cases, the examples applicable to both horizontally-oriented or vertically-oriented features.

Distribution of a material within a feature may be characterized by its step coverage. For the purposes of this description, "step coverage" is defined as a ratio of two thicknesses, e.g., the thickness of the material inside the feature divided by the thickness of the material near the opening. For purposes of this description, the term "inside the feature" represents a middle portion of the feature located about the middle point of the feature along the feature's axis, e.g., an area between about 25% and 75% of the distance or, in certain embodiments, between about 40% and 60% of the distance along the feature's depth measured from the feature's opening, or an end portion of the feature located between about 75% and 95% of the distance along the feature's axis as measured from the opening. The term "near the opening of the feature" or "near the feature's opening" represents a top portion of the feature located within 25% or, more specifically, within 10% of the opening's edge or other element representative of the opening's edge. Step coverage of over 100% can be achieved, for example, by filling a feature wider in the middle or near the bottom of the feature than at the feature opening or where a thicker film is deposited within the feature than on or near the opening.

The methods described herein involve deposition of a tungsten nucleation layer prior to deposition of a bulk layer. A nucleation layer is typically a thin conformal layer that facilitates subsequent deposition of bulk tungsten-containing material thereon. According to various embodiments, a nucleation layer may be deposited prior to any fill of the feature and/or at subsequent points during fill of the feature with tungsten or a tungsten-containing material.

In certain implementations, the nucleation layer is deposited sequentially injecting pulses of a reducing agent, optional purge gases, and tungsten-containing precursor from the reaction chamber. The process is repeated in a cyclical fashion until the desired thickness is achieved. Nucleation layer thickness can depend on the nucleation layer deposition method as well as the desired quality of bulk deposition. In general, nucleation layer thickness is sufficient to support high quality, uniform bulk deposition. Examples may range from 5 Å-100 Å, or 12 Å-50 Å.

Atomic layer deposition (ALD) techniques differ from chemical vapor deposition (CVD) techniques in which reactants are introduced together. In certain embodiments, the nucleation layer is deposited by an ALD process in which pulses of a reducing agent, optional purge gases, and tungsten-containing precursor are sequentially injected into and purged from the reaction chamber. The process is repeated in a cyclical fashion until the desired thickness is achieved.

Described herein are methods of depositing a tungsten nucleation layer that achieve good step coverage, low resistivity, and good fill. The methods involve using both a boron-containing reducing agent and a silicon-containing reducing agent to react with a tungsten-containing precursor in an ALD process.

ALD tungsten processes may use two half-reactions enabled by the sequential delivery of two or more co-reactants. One co-reactant acts to functionalize the surface and permit the adsorption of tungsten-containing species to the substrate. Subsequent cycles result in the deposition of a conformal thin film.

In some embodiments, a mixture of a boron-containing reducing agent and a silicon-containing reducing agent is pulsed alternately with a tungsten-containing precursor. One ALD cycle may be expressed as (B+S)/purge/W/purge, with B being a boron-containing reducing agent (e.g., diborane, $B_2H_6$), S being a silicon-containing reducing agent (e.g., silane, $SiH_4$), and W being a tungsten-containing precursor (e.g., $WF_6$). A purge between reactant pulses may be performed, with argon (Ar) other inert gas being used to purge.

In some embodiments, a pulses of a boron-containing reducing agent and a silicon-containing reducing agent delivered sequentially in a cycle such that one cycle may be represented as B/S/purge/W/purge or as S/B/purge/W/purge. According to various embodiments, there may or may not be a purge between B and S pulses. Thus, the cycle may be represented as B/purge/S/purge/W/purge or S/purge/B/purge/W/purge.

By using both boron-containing and silicon-containing reducing agents, the resulting tungsten has lower resistivity than silicon-containing reducing agent only processes and lower void percentage and stress than boron-containing reducing only processes. Large grains from a boron-only process result in low resistivity but cause voids when two tungsten surfaces come together. Using silicon-containing reducing agent mitigates the voids without sacrificing low resistivity. Better step coverage and lower void percentage reduce the line bending and stress.

Substrate temperatures are low enough to suppress decomposition of the boron-containing reducing agent and may be below about 350° C., for example between about 250° C. and 300° C. Even at these relatively low temperatures, diborane is susceptible to decomposition. $B_2H_6$ can decompose during the ALD cycle (e.g., $B_2H_6 \rightarrow 2/3B_3+3H_2$) which degrades the step coverage of the process. By using $B_2H_6$ and $SiH_4$, the decomposition of $B_2H_6$ is suppressed, improving step coverage. Deposition using silane typically uses higher temperatures; however, the temperature used for silane can be lowered with the use of the boron-containing reducing agent as well.

Examples of chamber pressure are between 10 torr and 60 torr, or 10 torr and 40 torr. In some embodiments, it is above 10 torr. It may also be below 10 torr to reduce fluorine incorporation, for example.

Figure 2A:
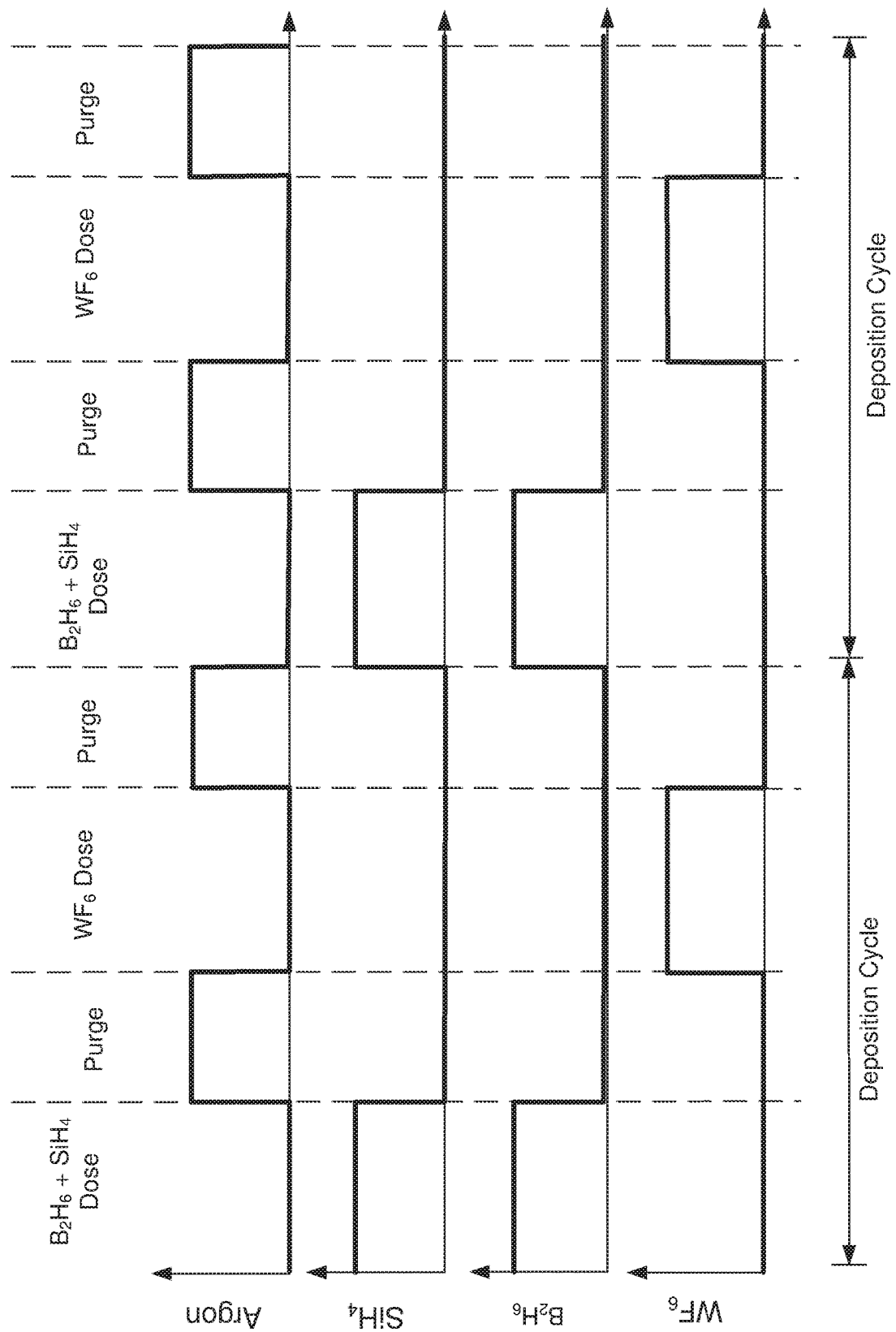
FIGS. 2A and 2B show examples timing sequence diagram showing example cycles of a method for depositing a tungsten nucleation layer.
Figure 2B:
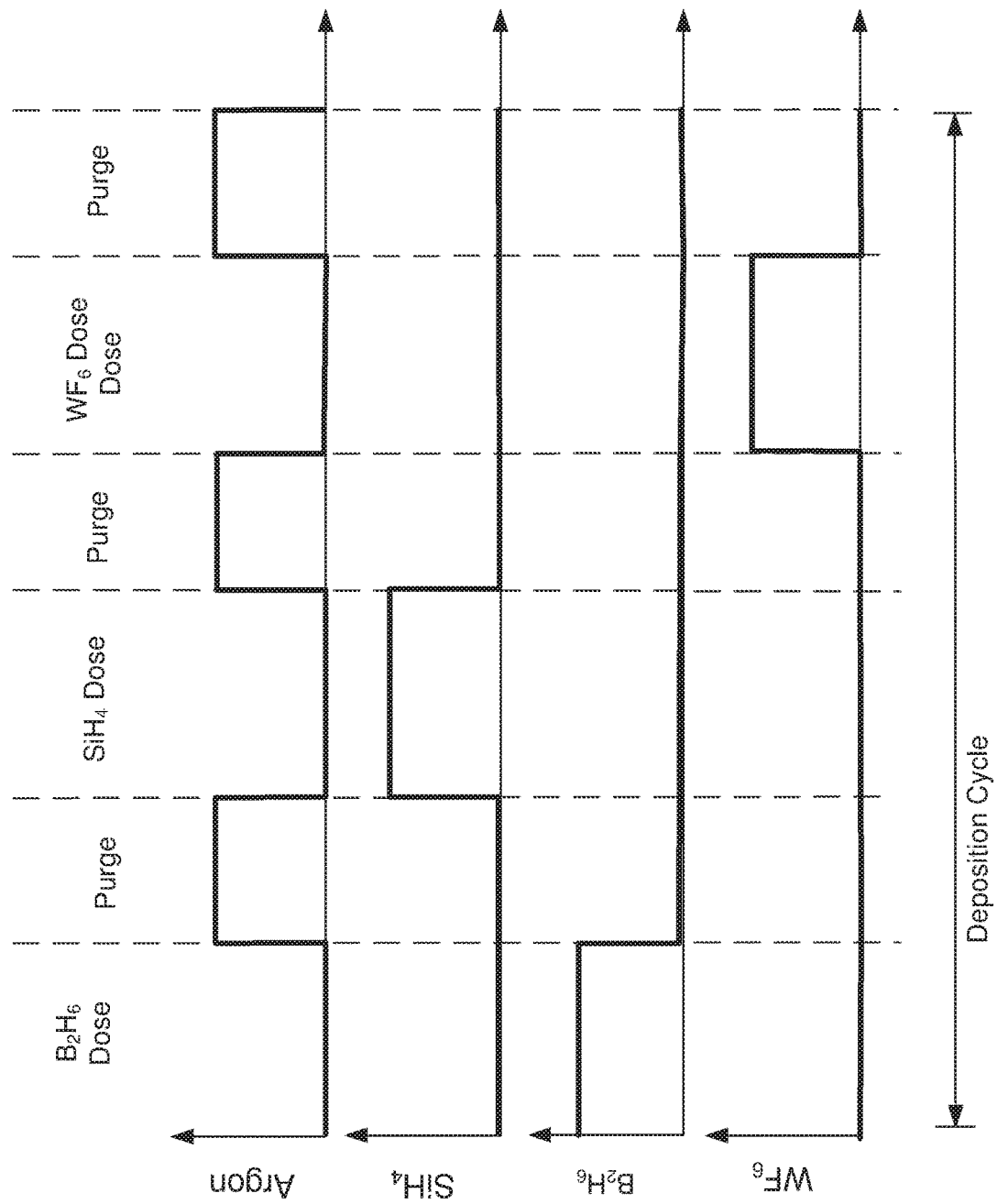

FIGS. 2A and 2B show examples timing sequence diagram showing example cycles of a method for depositing a tungsten nucleation layer, with FIG. 2A showing a co-flow of diborane and silane and FIG. 2B showing diborane and silane delivered in sequential consecutive reactant pulses.

Various modifications to the timing diagrams in FIGS. 2A and 2B may be made. In some embodiments, hydrogen may be flowed during the diborane and/or silane pulses. Flowing hydrogen during the diborane pulse can further suppress decomposition and help with step coverage.

In FIG. 2B, one or both of the diborane and silane pulses may be multi-pulses. For example, while FIG. 2B shows B/S/W (not including purges), a cycle could also be x(B)/y(S)/z(W), wherein x, y, and z are integers greater than zero. If x is 2, and y and z are 1, the sequence would be B/B/S/W, with optional purges between the pulses. In this manner, the ratio of boron to silicon may be tuned.

Similarly, silane may be first, e.g., x(S)/y(B)/z(W) wherein x, y, and z are integers greater than zero. In some embodiments, multiple boron-containing reducing agent or silicon-containing reducing agent pulses may be interspersed with the pulses of the other reducing agent (e.g., B/S/B/S/W).

Still further, in some embodiments, the one or more tungsten-containing precursor pulses may precede the reducing agent pulses in each cycle.

The tungsten-containing precursor may be a tungsten halide that can be reduced by a boron-containing reducing agent including tungsten fluorides (e.g., WF6) and tungsten chlorides (e.g., WCl5 and WCl6). While diborane is described above as the boron-containing reducing agent, the method may be implemented other boron-containing reducing agents. Examples include hexaborane and triborane. While silane is described above as the boron-containing reducing agent, the method may be implemented other silicon-containing reducing agents. Examples include disilane.

It should be noted that boron and/or silicon is generally not incorporated into the tungsten film at appreciable levels.

Bulk Deposition

After nucleation layer deposition, the feature may be filled with a bulk tungsten layer. In some implementations, tungsten bulk deposition can occur by a CVD process in which a reducing agent and a tungsten-containing precursor are flowed into a deposition chamber to deposit a bulk fill layer in the feature. In some implementations, tungsten bulk deposition can occur by an ALD process in which a reducing agent and a tungsten-containing precursor are sequentially introduced into a deposition chamber to deposit a bulk fill layer in the feature. If CVD is used, this operation can involve flowing the reactants continuously until the desired amount is deposited. In certain implementations, the CVD operation may take place in multiple stages, with multiple periods of continuous and simultaneous flow of reactants separated by periods of one or more reactant flows diverted. Still further, inhibition of tungsten growth and/or etching may be performed during feature fill.

Various tungsten containing gases including, but not limited to, WF6, WCl6, and W(CO)6 can be used as the tungsten-containing precursor. In certain implementations, the tungsten-containing precursor is a halogen-containing compound, such as WF6. In certain implementations, the reducing agent is hydrogen gas, though other reducing agents may be used including silane (SiH4), disilane (Si2H6) hydrazine (N2H4), diborane (B2H6) and germane (GeH4). In many implementations, hydrogen gas is used as the reducing agent in the CVD process. In some other implementations, a tungsten precursor that can decompose to form a bulk tungsten layer can be used. Bulk deposition may also occur using other types of processes including ALD processes.

Deposition may proceed according to various implementations until a certain feature profile is achieved and/or a certain amount of tungsten is deposited. In some implementations, the deposition time and other relevant parameters may be determined by modeling and/or trial and error. For example, for an initial deposition for an inside out fill process in which tungsten can be conformally deposited in a feature until pinch-off, it may be straightforward to determine based on the feature dimensions the tungsten thickness and corresponding deposition time that will achieve pinch-off. In some implementations, a process chamber may be equipped with various sensors to perform in-situ metrology measurements for end-point detection of a deposition operation. Examples of in-situ metrology include optical microscopy and X-Ray Fluorescence (XRF) for determining thickness of deposited films.

It should be understood that the tungsten films described herein may include some amount of other compounds, dopants and/or impurities such as nitrogen, carbon, oxygen, boron, phosphorous, sulfur, silicon, germanium and the like, depending on the particular precursors and processes used. The tungsten content in the film may range from 20% to 100% (atomic) tungsten. In many implementations, the films are tungsten-rich, having at least 50% (atomic) tungsten, or even at least about 60%, 75%, 90%, or 99% (atomic)  tungsten. In some implementations, the films may be a mixture of metallic or elemental tungsten (W) and other tungsten-containing compounds such as tungsten carbide (WC), tungsten nitride (WN), etc.

CVD and ALD deposition of these materials can include using any appropriate precursors. For example, CVD and ALD deposition of tungsten nitride can include using halogen-containing and halogen-free tungsten-containing and nitrogen-containing compounds.

EXPERIMENTAL

ALD of tungsten nucleation layers was performed in a 3D-NAND structures of using Processes A and B. Void percentage was measured at various wordline (WL) heights. The ALD tungsten nucleation process was followed by a bulk tungsten deposition process that was the same for all processes.

Process A: multiple cycles of (B2H6—Ar purge—WF6—Ar purge)

Process B: multiple cycles of (B2H6 Ar purge—SiH4 Ar purge—WF6)

|  | Process A | Process B |
|---|---|---|
| Top void % | 1.2% +− 1.5% | 6.9% +− 8.6% |
| Middle void % | 10.5% +− 4.6% | 1.9% +− 1.8% |
| Bottom void % | 17.1% +− 14.5% | 7.9% +− 2.3% |
| Average void % | 9.7% +− 10.7% | 5.6% +− 5.6% |

As can be seen from the above table, using silane and diborane results in significantly reduced void percentage. Process C: multiple cycles of (B2H6+SiH4 mixture—Ar purge—WF6) was used and resulted in an average void percentage of 7.7%, as compared to 9.7% for boron only.

Process details are shown in the table below.

|  | Parameter | Process A | Process B | Process C |
|---|---|---|---|---|
| Nucleation ALD | Pulse Sequence | 5 cycles (B/B/B/W) All Charge Volume | 5 cycles (B/S/W) All Charge Volume | 5 cycles (B + S/W) All Charge Volume |
|  | Temperature | 300 C. | 275 C. | 275 C. |
|  | B2H6 and SiH4 timing divert/line charge/dose/purge | 0/9/5/30 | 0/9/5/9 | 0/9/5/9 |
|  | WF6 timing divert/line charge/dose/purge | 2/0.8/10/30 | 0/4.5/10/30 | 0/4.5/10/30 |
|  | B2H6/SiH4/Ar/WF6 flows(sccm) | 1350/0/0/1350 | 450/450/900/1350 | 1350/150/1200/1350 (*Ar flowing only during SiH4 to fully charge the SiH4 charge volume) |
| Bulk ALD | Pulse Sequence |  | H/WF6 |  |
|  | Cycle time (sec) |  | .77 |  |
|  | Temp |  | 430 C. |  |
|  | # cycles |  | 1200 |  |

Film properties were measured for films deposited on planar substrate using Process D, E, or F to deposit the nucleation layer. Bulk deposition was the same for all processes.

Process D: multiple cycles of (B2H6 Ar purge—WF6 Ar purge); substrate temp during nucleation layer of 225° C.

Process E: multiple cycles of (B2H6 Ar purge—SiH4—Ar purge—WF6); substrate temp during nucleation layer of 300° C.

Process F: multiple cycles of (B2H6 Ar purge—SiH4—Ar purge—WF6); substrate temp during nucleation layer of 275° C.

Process details are shown in the table below

| | Parameter | Process D | Process E | Process F |
|---|---|---|---|---|
| Nucleation ALD | Pulse Sequence | 5 cycles (B/B/B/W) All Charge Volume | 5 cycles (B/S/W) All Charge Volume | 5 cycles (B + S/W) All Charge Volume |
| | Temperature | 225 C. | 300 C. | 275 C. |
| | B2H6 flow (sccm) | 1350 | 450 | 450 |
| | Ar with B2H6 (sccm) | 0 | 900 | 900 |
| | SiH4 flow (sccm) | 0 | 450 | 450 |
| | Ar with SiH4 (sccm) | 0 | 900 | 900 |
| | WF6 flow (sccm) | 1350 | 1350 | 1350 |
| Bulk ALD | Pulse Sequence | | H/WF6 | |
| | Cycle time (sec) | | .77 | |
| | Temp | | 430 C. | |
| | # cycles | | 1200 | |

Film (nuc+bulk) properties are shown in the table below

| Property | Process D | Process E | Process F |
|---|---|---|---|
| Film Rs Cp (Ohms/sq) | 11.17 | 10.32 | 10.99 |
| Film Rs Mean (Ohms/sq) | 11.39 | 9.68 | 10.41 |
| Rs NU % | 4.73 | 3.36 | 3.25 |
| Resistivity | 22.06 | 20.03 | 20.56 |
| FSM Mean Stress | −627.51 | 64.7 | −207.62 |
| Thickness (A) | 188.37 | 194.16 | 187.1 |

The results in the above table show that film resistivity is improved by using the boron-containing and silicon-containing reducing agent to form the nucleation layer. Stress can be lowered by reducing temperature without compromising fill.

Apparatus

Any suitable chamber may be used to implement the disclosed embodiments. Example deposition apparatuses include various systems, e.g., ALTUS® and ALTUS® Max, available from Lam Research Corp., of Fremont, California, or any of a variety of other commercially available processing systems. In some embodiments, atomic layer deposition (ALD) may be performed at a first station that is one of two, five, or even more deposition stations positioned within a single deposition chamber. Thus, for example, a diborane (B2H6)/silane (SiH4) co-flow and tungsten hexafluoride (WF6) may be introduced in alternating pulses to the surface of the semiconductor substrate, at the first station, using an individual gas supply system that creates a localized atmosphere at the substrate surface. Another station may be used for tungsten bulk layer deposition. Two or more stations may be used to deposit tungsten in parallel processing. Alternatively a wafer may be indexed to have operations performed over two or more stations sequentially. In another example, diborane, silane, and tungsten-precursor doses may be introduced sequentially, optionally separated by purges, at a first station to deposit a nucleation layer. Still further, one or more of these reactant pulses may be performed at one or more additional stations such that the tungsten nucleation layer deposition is performed at multiple stations.

Figure 3:
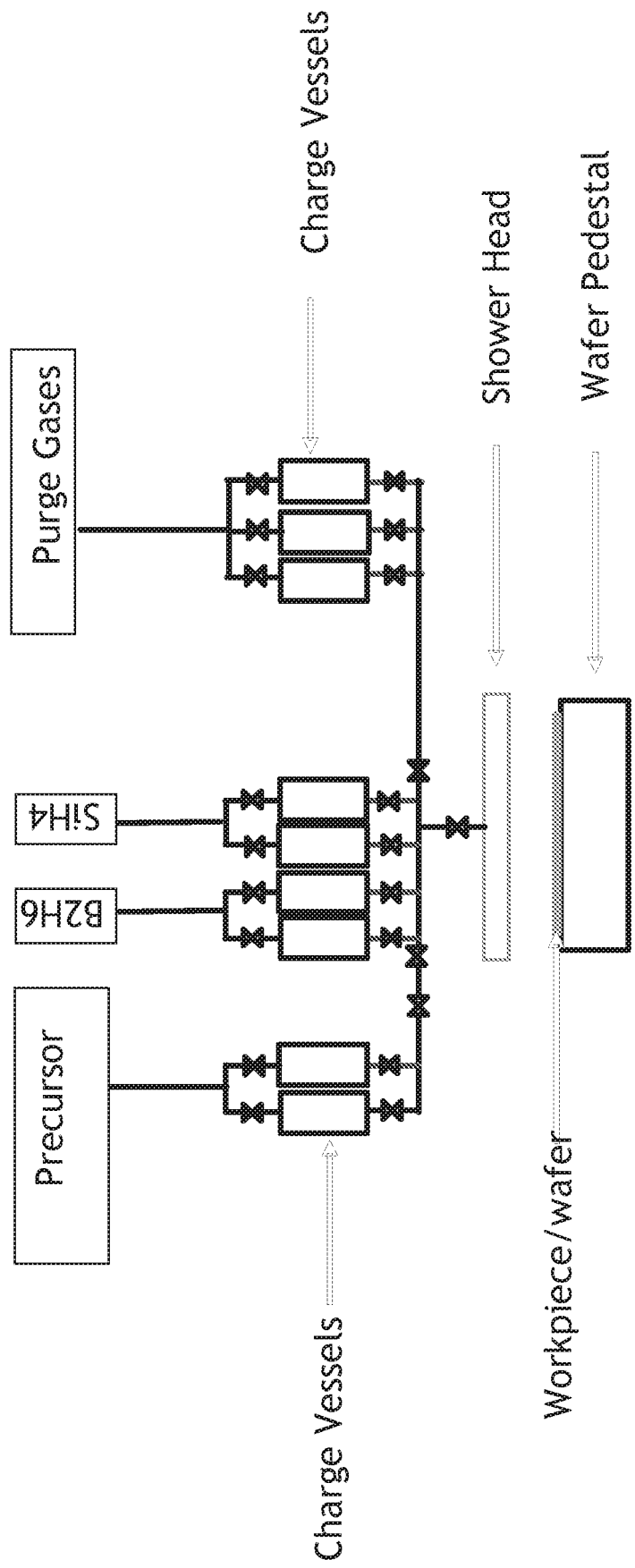
FIG. 3 shows a schematic example of an apparatus including charge volumes to introduce the gas doses to the chamber that may be used to implement methods described herein.

In some embodiments, a charge volumes (also referred to as charge vessels) are used to introduce the gas doses to the chamber. FIG. 3 shows an example of such a system, in which separate charge volumes are used for silane and diborane. This allows the silane and diborane to be introduced separately to the chamber (either co-flowed or sequential doses) and prevents reactions from occurring prior to introduction.

Figure 4:
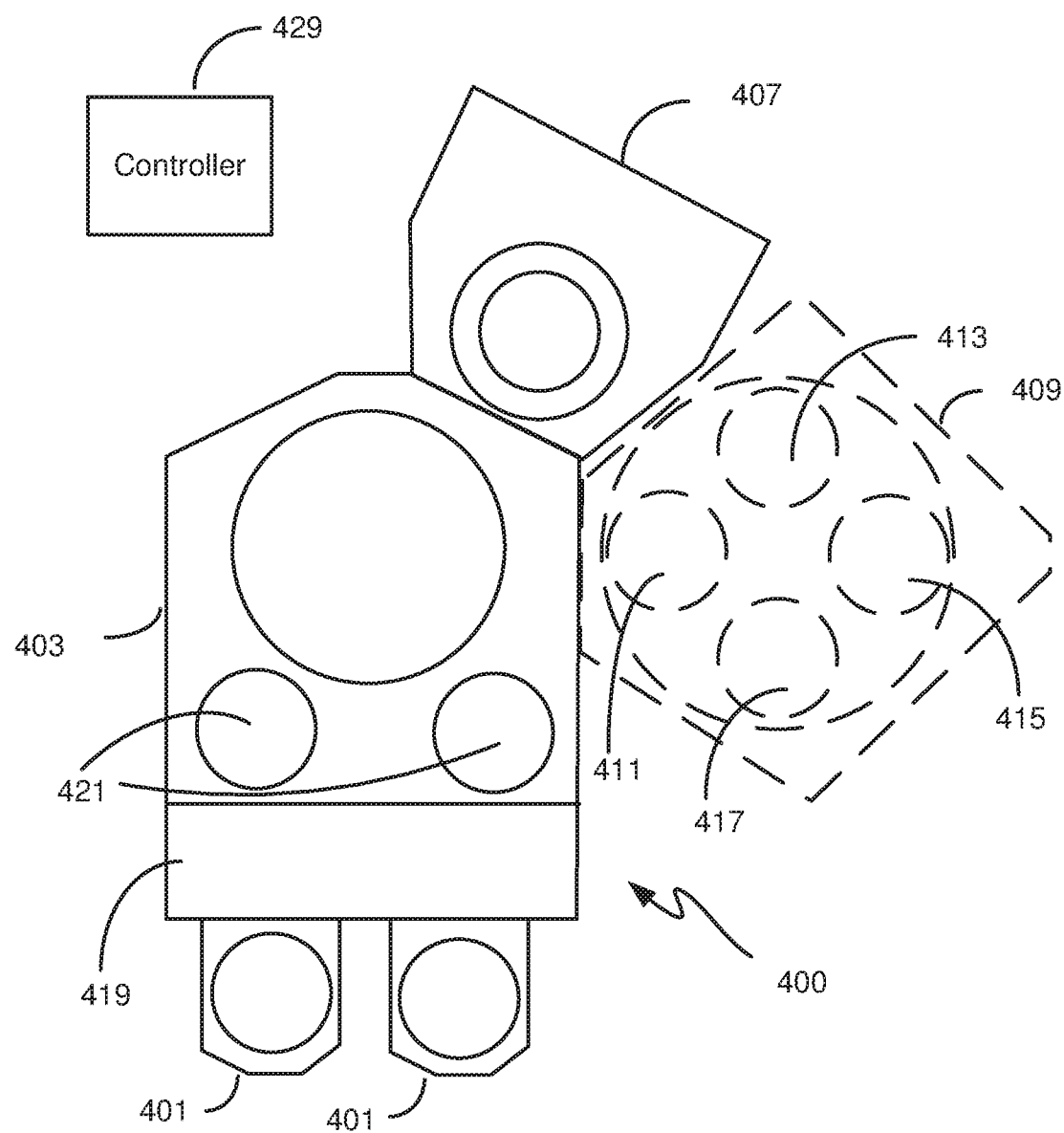
FIG. 4 shows a schematic example of a process system suitable for conducting deposition processes in accordance with embodiments.

FIG. 4 is a schematic of a process system suitable for conducting deposition processes in accordance with embodiments. The system 400 includes a transfer module 403. The transfer module 403 provides a clean, pressurized environment to minimize risk of contamination of substrates being processed as they are moved between various reactor modules. Mounted on the transfer module 403 is a multi-station reactor 409 capable of performing ALD and CVD according to various embodiments. Multi-station reactor 409 may include multiple stations 411, 413, 415, and 417 that may sequentially perform operations in accordance with disclosed embodiments. For example, multi-station reactor 409 may be configured such that station 411 performs a tungsten nucleation layer deposition using a chlorine-containing tungsten precursor or a fluorine-containing precursor, and station 413 performs an ALD tungsten deposition operation according to various embodiments. In some embodiments, station 415 may also form an ALD tungsten deposition operation, and station 417 may perform a CVD operation.

Figure 5:
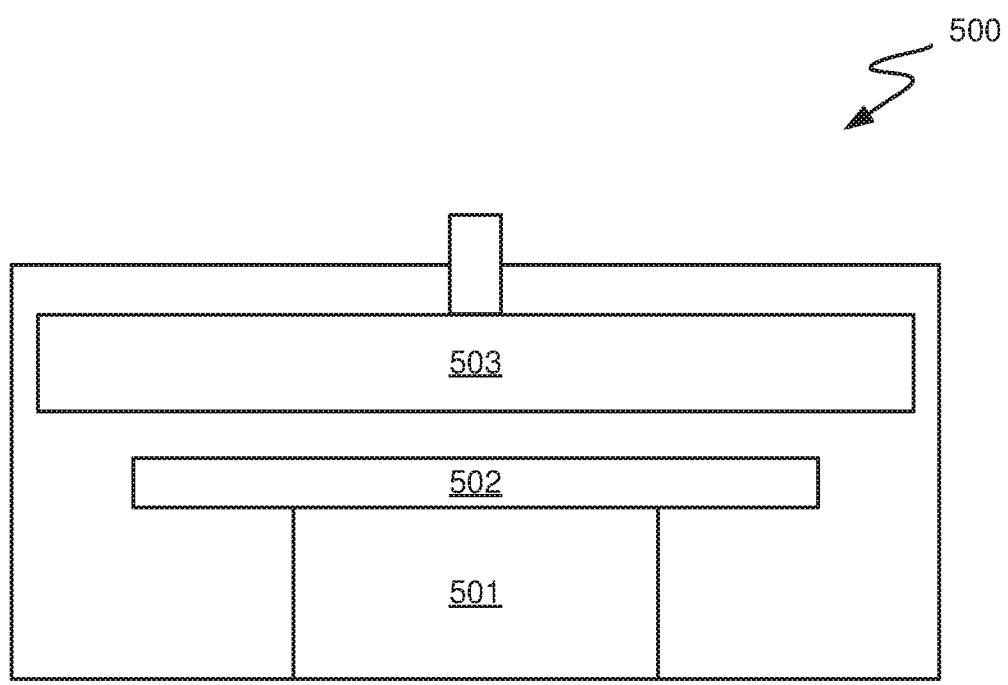
FIG. 5 shows a schematic example of a process station suitable for conducting deposition processes in accordance with embodiments.

Stations may include a heated pedestal or substrate support, one or more gas inlets or showerhead or dispersion plate. An example of a deposition station 700 is depicted in FIG. 5, including substrate support 502 and showerhead 503. A heater may be provided in pedestal portion 501.

Returning to FIG. 4, also mounted on the transfer module 503 may be one or more single or multi-station modules 407 capable of performing plasma or chemical (non-plasma) pre-cleans, other deposition operations, or etch operations. The module may also be used for various treatments to, for example, prepare a substrate for a deposition process. The system 400 also includes one or more wafer source modules 401, where wafers are stored before and after processing. An atmospheric robot (not shown) in the atmospheric transfer chamber 419 may first remove wafers from the source modules 401 to loadlocks 421. A wafer transfer device (generally a robot arm unit) in the transfer module 403 moves the wafers from loadlocks 421 to and among the modules mounted on the transfer module 403.

In various embodiments, a system controller 429 is employed to control process conditions during deposition. The controller 429 will typically include one or more memory devices and one or more processors. A processor may include a CPU or computer, analog and/or digital input/output connections, stepper motor controller boards, etc.

The controller 429 may control all of the activities of the deposition apparatus. The system controller 429 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 429 may be employed in some embodiments.

Typically there will be a user interface associated with the controller 429. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 429. The signals for controlling the process are output on the analog and digital output connections of the deposition apparatus 400.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 429 is part of a system, which may be part of the above-described examples. Such systems can include semiconductor processing equipment, including a processing tool or tools, chamber and/or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 429, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 429, in some implementations, may be a part of or coupled to a computer that is integrated with, coupled to the system, otherwise networked to the system, or a combination thereof. For example, the controller 429 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 429 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The apparatus may include a gas manifold system, which provides line charges to the various gas distribution lines as shown schematically in FIG. 4. Manifold 404 has an input 402 from a source of a tungsten-containing precursor gas (not shown), manifold 411 has an input 409 from a source of hydrogen or other reducing gas (not shown) and manifold 421 has an input 419 from a source of inert purge gas (not shown). The manifolds 404, 411 and 421 provide the tungsten-containing precursor gas, reducing gas and purge gas to the deposition chamber through valved distribution lines, 405, 413 and 425 respectively. The various valves are opened or closed to provide a line charge, i.e., to pressurize the distribution lines. For example, to pressurize distribution line 405, valve 406 is closed to vacuum and valve 408 is closed. After a suitable increment of time, valve 408 is opened and the tungsten-containing precursor gas is delivered to the chamber. Charging the tungsten precursor to a high pressure during ALD deposition of the bulk layer (e.g., to 400 Torr) can improve resistivity in some embodiments. After a suitable time for delivery of the gas, valve 408 is closed. The chamber can then be purged to a vacuum by opening of valve 406 to vacuum.

Similar processes are used to deliver the reducing gas and the purge gas. To introduce the reducing gas, for example, distribution line 413 is charged by closing valve 415 and closing valve 417 to vacuum. Opening of valve 415 allows for delivery of the reducing gas to the chamber. Similarly, to introduce the purge gas, distribution line 425 is charged by closing valve 427 and closing valve 423 to vacuum. Opening of valve 427 allows for delivery of the argon or other inert purge gas to the chamber. The amount of time allowed for line charges changes the amount and timing of the initial delivery of the gas.

FIG. 4 also shows vacuum pumps in which valves 406, 417 and 423, respectively, can be opened to purge the system. The supply of gas through the various distribution lines is controlled by a controller, such as a mass flow controller which is controlled by a microprocessor, a digital signal processor or the like, that is programmed with the flow rates, duration of the flow, and the sequencing of the processes.

Note that the processes described above may require precise timing of valves and mass flow controllers (MFCs) supplying pulses of reagent to the semiconductor substrate during deposition. In one way to make this possible, valve and MFC commands are delivered to embedded digital input-output controllers (IOC) in discrete packets of information containing instructions for all time-critical commands for all or a part of a deposition sequence. The ALTUS systems of Lam Research provide at least one IOC sequence. The IOCs can be physically located at various points in the apparatus; e.g., within the process module or on a stand-alone power rack standing some distance away from the process module. There may be multiple IOCs in each module (e.g., 3 per module). With respect to the actual instructions included in a sequence, all commands for controlling valves and setting flow for MFCs (for all carrier and reactant gases) may be included in a single IOC sequence. This assures that the timing of all the devices is tightly controlled from an absolute standpoint and also relative to each other. There are typically multiple IOC sequences running at any given time. This allows for, say, ALD to run at station 1-2 with all timing controlled for all the hardware components needed to deposit a ALD-W nucleation layer at those stations. A second sequence might be running concurrently to deposit a tungsten bulk using the timing sequence described above at other deposition stations in the same module. The relative timing of the devices controlling the delivery of reagents to stations 3-4 is important within that group of devices, but the relative timing of the ALD process at stations 1-2 can be offset from the relative timing of stations 3-4. An IOC translates the information in a packetized sequence and delivers digital or analog command signals directly to MFC or pneumatic solenoid banks controlling the valves.

A pulse of tungsten-containing gas may be generated as follows. Initially, the system diverts WF6 to a vacuum pump for a period of time while the MFC or other flow-controlling device stabilizes. This may be done for a period of between about 0.5 to 5 seconds in one example. Next, the system pressurizes the tungsten gas delivery manifold by closing both the divert outlet 406 and the outlet 408 to the deposition chamber. This may be done for a period of between about 0.1 and 5 seconds, for example, to create an initial burst of reagent when the outlet to the deposition chamber is opened. This is accomplished by opening outlet valve 408 for between about 0.1 and 10 seconds in one example. Thereafter, the tungsten-containing gas is purged from the deposition chamber using a suitable purge gas. The pulsed flow of other reagents may be done in a similar manner.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method comprising:
   providing a substrate including a feature in a chamber;
   depositing a tungsten nucleation layer in the feature by performing one or more cycles of an atomic layer deposition (ALD) process, where each cycle comprises:
   flowing one or more boron-containing reducing agent doses in the chamber,
   flowing one or more silicon-containing reducing agent doses in the chamber, wherein the one or more boron-containing reducing agent doses and the one or more silicon-containing reducing agent doses are sequential reactant doses, and
   after flowing the one or more boron-containing reducing agent doses and one or more silicon-containing reducing agent doses in the chamber, flowing one or more tungsten-containing precursor pulses in the chamber,
   wherein during the deposition of the tungsten nucleation layer, the substrate temperature is low enough to suppress decomposition of the boron-containing reducing agent.

2. The method of claim 1, wherein the feature is a wordline (WL) feature in a 3-D NAND structure, the 3-D NAND structure comprising vertically-oriented sidewalls, a plurality of openings in the sidewalls leading to a plurality of horizontally-oriented WL features.

3. The method of claim 1, further comprising purging the chamber between sequential reactant doses.

4. The method of claim 1, further comprising, depositing a bulk tungsten layer on the tungsten nucleation layer.

5. The method of claim 4, wherein the bulk tungsten layer is deposited by an (Original) atomic layer deposition process using hydrogen ($H_2$) as a reducing agent.

6. The method of claim 1, wherein each cycle begins with a boron-containing reducing agent dose.

7. The method of claim 1, wherein each cycle begins with a silicon-containing reducing agent dose.

8. The method of claim 1, wherein the substrate temperature of the substrate is below 300° C.

9. The method of claim 1, wherein the tungsten nucleation layer comprises at least 99% tungsten.

10. The method of claim 1, wherein the tungsten nucleation layer is 100% tungsten.

11. A method comprising:
    providing a 3-D NAND structure comprising vertically-oriented sidewalls, a plurality of openings in the sidewalls leading to a plurality of horizontally-oriented wordline (WL) features in a chamber;
    depositing a tungsten nucleation layer in the WL features by performing one or more cycles of an atomic layer deposition (ALD) process, where each cycle comprises
    flowing one or more boron-containing reducing agent doses in the chamber,
    flowing one or more silane doses in the chamber; and
    after flowing the one or more boron-containing reducing agent doses and one or more silicon-containing reducing agent doses in the chamber, flowing one or more tungsten-containing precursor pulses in the chamber,
    wherein during the deposition of the tungsten nucleation layer, the substrate temperature is low enough to suppress decomposition of the boron-containing reducing agent.

12. The method of claim 11, wherein the one or more boron-containing reducing agent doses and the one or more silicon-containing reducing agent doses are sequential reactant doses.

13. The method of claim 12, wherein each cycle begins with a boron-containing reducing agent dose.

14. The method of claim 12, wherein each cycle begins with a silicon-containing reducing agent dose.

15. The method of claim 11, wherein a boron-containing reducing agent dose is co-flowed with a silicon-containing reducing agent dose.

16. The method of claim 11, further comprising purging the chamber between sequential reactant doses.

17. The method of claim 11, further comprising, depositing a bulk tungsten layer on the tungsten nucleation layer.

18. The method of claim 17, wherein the bulk tungsten layer is deposited by an atomic layer deposition process using hydrogen ($H_2$) as a reducing agent.

19. The method of claim 11, wherein the temperature of the 3-D NAND structure is below 300° C.

20. The method of claim 11, wherein the tungsten nucleation layer comprises at least 99% tungsten.

21. The method of claim 11, wherein the tungsten nucleation layer is 100% tungsten.

* * * * *